(12) United States Patent
Chuang et al.

(10) Patent No.: US 9,368,603 B2
(45) Date of Patent: Jun. 14, 2016

(54) CONTACT FOR HIGH-K METAL GATE DEVICE

(71) Applicant: Taiwan Semiconductor Manufacturing Company, Ltd., Hsin-Chu (TW)

(72) Inventors: Harry-Hak-Lay Chuang, Singapore (SG); Huan-Just Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/507,064

(22) Filed: Oct. 6, 2014

(65) Prior Publication Data
US 2015/0021672 A1    Jan. 22, 2015

Related U.S. Application Data

(60) Continuation-in-part of application No. 13/971,267, filed on Aug. 20, 2013, now Pat. No. 8,853,753, which is a division of application No. 13/289,112, filed on Nov. 4, 2011, now Pat. No. 8,546,227.

(60) Provisional application No. 61/535,140, filed on Sep. 15, 2011.

(51) Int. Cl.
| H01L 21/3205 | (2006.01) |
| H01L 21/4763 | (2006.01) |
| H01L 21/336 | (2006.01) |
| H01L 21/76 | (2006.01) |
| H01L 21/44 | (2006.01) |
| H01L 29/66 | (2006.01) |
| H01L 29/78 | (2006.01) |
| H01L 21/8238 | (2006.01) |
| H01L 29/417 | (2006.01) |
| H01L 29/423 | (2006.01) |
| H01L 29/49 | (2006.01) |
| H01L 21/768 | (2006.01) |
| H01L 21/28 | (2006.01) |
| H01L 29/51 | (2006.01) |

(52) U.S. Cl.
CPC .... *H01L 29/66795* (2013.01); *H01L 21/28088* (2013.01); *H01L 21/28114* (2013.01); *H01L 21/76805* (2013.01); *H01L 21/76816* (2013.01); *H01L 21/823821* (2013.01); *H01L 21/823842* (2013.01); *H01L 29/41775* (2013.01); *H01L 29/42376* (2013.01); *H01L 29/4966* (2013.01); *H01L 29/665* (2013.01); *H01L 29/6653* (2013.01); *H01L 29/6656* (2013.01); *H01L 29/6659* (2013.01); *H01L 29/66545* (2013.01); *H01L 29/785* (2013.01); *H01L 29/517* (2013.01); *H01L 29/7833* (2013.01)

(58) Field of Classification Search
CPC . H01L 29/49; H01L 29/785; H01L 29/66795; H01L 29/78
USPC .......................... 438/299, 409, 591, 666, 669
See application file for complete search history.

(56) References Cited

U.S. PATENT DOCUMENTS

2012/0187459 A1    7/2012    Pan et al.

*Primary Examiner* — David S Blum

(57) ABSTRACT

An integrated circuit having an improved gate contact and a method of making the circuit are provided. In an exemplary embodiment, the method includes receiving a substrate. The substrate includes a gate stack disposed on the substrate and an interlayer dielectric disposed on the gate stack. The interlayer dielectric is first etched to expose a portion of the gate electrode, and then the exposed portion of the gate electrode is etched to form a cavity. The cavity is shaped such that a portion of the gate electrode overhangs the electrode. A conductive material is deposited within the cavity and in electrical contact with the gate electrode. In some such embodiments, the etching of the gate electrode forms a curvilinear surface of the gate electrode that defines the cavity.

19 Claims, 23 Drawing Sheets

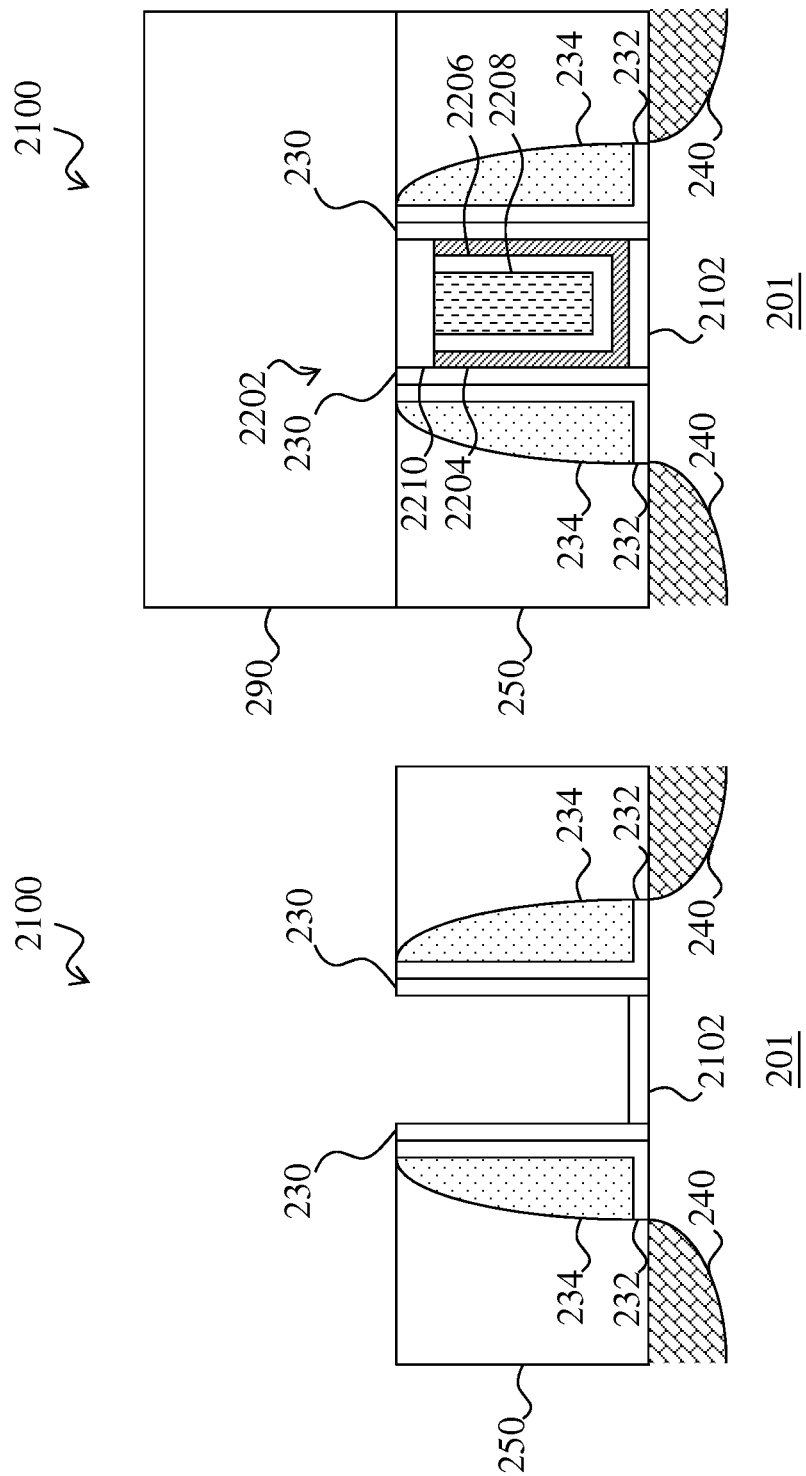

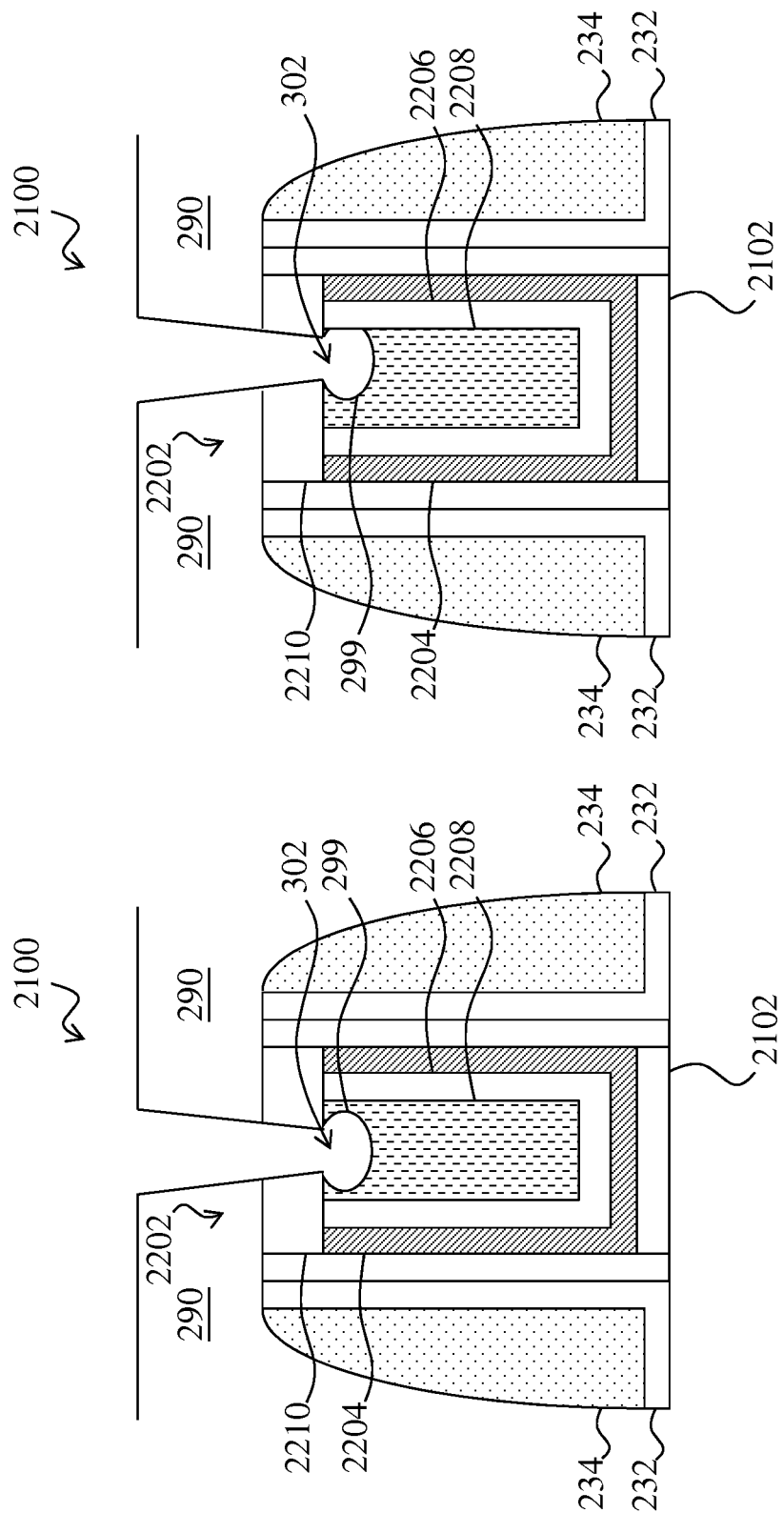

CONTACT FOR HIGH-K METAL GATE DEVICE

CROSS-REFERENCE TO RELATED APPLICATIONS

The present application is a continuation-in-part of U.S. Ser. No. 13/971,267 filed on Aug. 20, 2013, now U.S. Pat. No. 8,853,753, entitled "CONTACT FOR HIGH-K METAL GATE DEVICE", which is a divisional of U.S. Ser. No. 13/289,112 filed on Nov. 4, 2011, now U.S. Pat. No. 8,546,227, issued Oct. 1, 2013, entitled "CONTACT FOR HIGH-K METAL GATE DEVICE," which claims the benefit of U.S. Ser. No. 61/535,140 filed Sep. 15, 2011, the entire disclosure of each of which is incorporated herein by reference in its entirety.

BACKGROUND

There are several continuing areas of development and improvement for semiconductor device fabrication. One such area is device size. The size, including width, of a gate structure in metal-oxide-semiconductor field-effect transistor (MOSFET) devices continues to shrink, providing benefits such as increased density and reduced power. Another area is the use of MOSFET devices having a high dielectric constant (high-k) material and a metal gate.

Yet another avenue of inquiry is the development of three-dimensional designs, such as a fin-like field effect transistor (FinFET). A FinFET can be thought of as a typical planar device extruded out of a substrate and into the gate. A typical FinFET is fabricated on a thin "fin" (or fin structure) extending upwards from the body from the substrate, and may be formed by depositing fin material on the substrate, etching non-fin areas of the substrate, or a combination thereof. The channel of the FET is formed in this vertical fin, and a gate is provided over (e.g., wrapping) the fin. Wrapping the gate around the fin increases the contact area between the channel region and the gate and allows the gate to control the channel from both sides. This may result in higher current flow, a reduction in short channel effect, and other advantages. The present disclosure provides improvements that relate to the fabrication of planar devices as well as FinFETs and other non-planar devices.

SUMMARY

The present disclosure provides many different embodiments of methods for making integrated circuit devices. In one embodiment, a method of making an integrated circuit includes providing a substrate and forming a metal structure over the substrate. A dielectric is formed over the metal structure and a first etch process creates a trench in the dielectric over the metal structure. A second, isotropic etch process forms an undercut in the metal structure, the undercut being proximate to the trench. The trench and undercut are filled with a conductive material, such as tungsten, to contact the metal structure.

In another embodiment, a method for making an integrated circuit includes providing a substrate with a high-k dielectric and providing a polysilicon gate structure over the high-k dielectric. A doping process is performed on the substrate adjacent to the polysilicon gate structure, after which the polysilicon gate structure is removed and replaced with a metal gate structure. An interlayer dielectric (ILD) is deposited over the metal gate structure and the doped substrate, and a dry etch process forms a trench in the ILD to a top surface of the metal gate structure. After the dry etch process, a wet etch process forms an undercut near the top surface of the metal gate structure. The trench and undercut are then filled with a metal material.

The present disclosure also provides an integrated circuit. In one embodiment, the integrated circuit includes a semiconductor substrate having source and drain regions. A gate dielectric is provided over the semiconductor substrate, and a metal gate structure is provided over the semiconductor substrate and the gate dielectric and between the source and drain regions. An interlayer dielectric (ILD) is provided over the semiconductor substrate. The integrated circuit further includes first and second contacts extending through the ILD and adjacent the source and drain regions, respectively; and a third contact extending through the ILD and adjacent a top surface of the metal gate structure. The third contact extends into an undercut region of the metal gate structure.

In some embodiments, the method includes receiving a circuit element that includes a gate stack disposed on a semiconductor substrate and an interlayer dielectric disposed on the gate stack. In turn, the gate stack includes a gate electrode. The interlayer dielectric is etched to expose a portion of the gate electrode, and the gate electrode is etched to form a cavity shaped such that a portion of the gate electrode overhangs the cavity. A conductive material is deposited within the cavity and in electrical contact with the gate electrode. In one such embodiment, the etching of the gate electrode is configured to form a curvilinear surface of the gate electrode that defines the cavity. In another such embodiment, the gate stack further includes a work function layer disposed adjacent to the gate electrode, and the etching of the gate electrode is configured to expose a portion of the work function layer without etching the work function layer.

In some embodiments, the method includes receiving a substrate that has a gate stack disposed thereupon and an interlayer material disposed on and around the gate stack. The gate stack includes a dielectric layer disposed on the substrate; and a gate electrode disposed on the dielectric layer. An etching technique is performed on the interlayer material to expose a portion of the gate electrode, and an isotropic etch of the gate electrode is performed to form a recess having a maximum width located in an interior portion of the gate electrode. A conductive material is deposited within the recess and within an etched portion of the interlayer material to form a gate contact. In one such embodiment, the isotropic etch of the gate electrode is configured to form the recess having a curvilinear profile.

In yet further embodiments, the integrated circuit includes a device gate disposed on a substrate. In turn, the device gate includes an interfacial layer disposed on the substrate, a dielectric material disposed on the interfacial layer, and a gate electrode disposed on the dielectric material. The integrated circuit also includes a contact extending into and conductively coupled to the gate electrode. The contact is shaped such that a portion of the gate electrode is disposed on the contact opposite the substrate. In one such embodiment, the contact is further shaped such that the gate electrode and the contact have a curvilinear interface. In another such embodiment, the integrated circuit further includes an adhesion structure disposed between the contact and the gate electrode.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Also, several elements and features are shown in the figures, not all of which are numbered for the sake of clarity. It is understood, however, that symmetrical features and items will be similarly situated.

FIGS. 21-27B are cross-sectional views of a semiconductor device undergoing the fabrication method of FIG. 20 according to various embodiments of the present invention.

DETAILED DESCRIPTION

Figure 1:
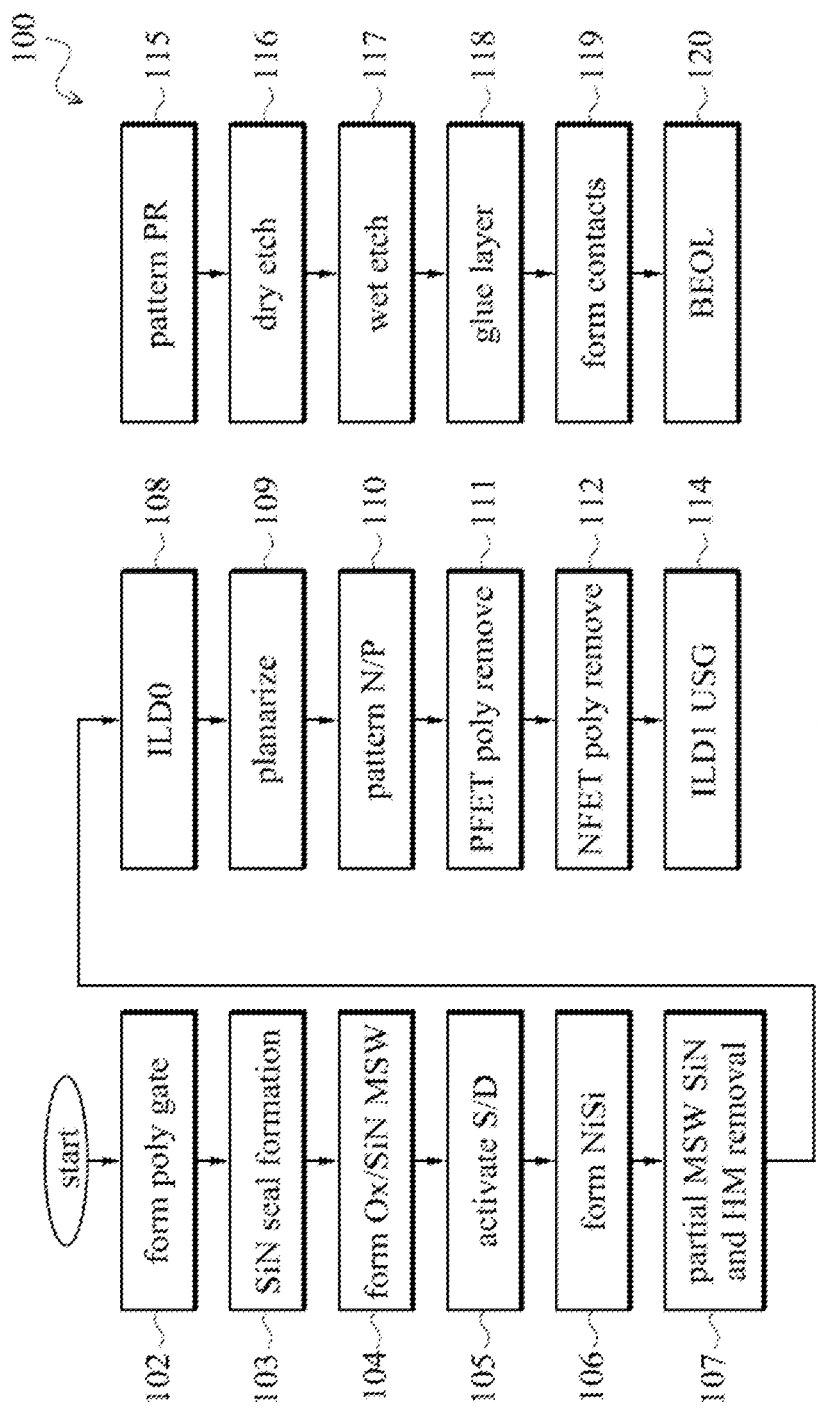
FIG. 1 is a flowchart of a method of making the semiconductor device having a metal gate stack according to one embodiment of the present invention.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor device according to one embodiment. The semiconductor device includes an n-type field-effect transistor (NFET) and a p-type field-effect transistor (PFET), both with a metal gate stack constructed according to various aspects of the present disclosure. FIGS. 2 through 19 are sectional views of a semiconductor structure 200 at various fabrication stages and constructed according to one or more embodiments. The semiconductor structure 200 and the method 100 of making the same are collectively described with reference to FIGS. 1 through 19.

Figure 2:
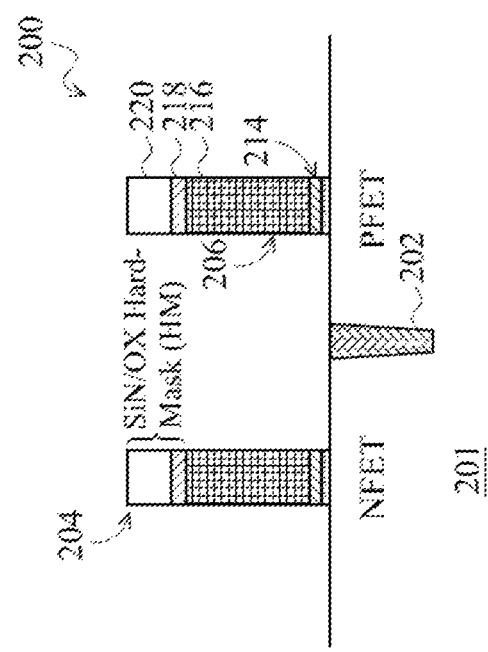

Referring to FIGS. 1 and 2, the method 100 begins at step 102 by providing a semiconductor substrate 201 on which to form a polysilicon gate. The substrate 201 may be any suitable workpiece upon which features may be formed, and an exemplary substrate 201 is a bulk silicon substrate. Alternatively, the substrate 201 may comprise an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, calcium fluoride ($CaF_2$); and/or combinations thereof. Possible substrates 201 also include a silicon-on-insulator (SOI) substrate and other layered substrates 201. In the illustrated embodiment, the semiconductor substrate 201 includes silicon. Alternatively, the substrate includes germanium, silicon germanium or other proper semiconductor materials. The semiconductor substrate also includes various doped regions such as n-well and p-wells.

The semiconductor substrate 201 includes an isolation feature such as shallow trench isolation (STI) 202 formed in the substrate to separate NFET and PFET transistors. The formation of the STI feature includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. In one embodiment, the STI feature 202 is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. The semiconductor substrate 201 also includes various n-wells and p-wells formed in various active regions.

Two similar polysilicon gate stacks 204, 206 are formed on the substrate 201, on either side of the STI structure 202. In the present embodiment, each polysilicon gate stack 204, 206 includes (viewed in the figure from the substrate 201 up), a silicon oxide interfacial layer (IL), a high-k dielectric layer (HK) and a cap layer, generally designated with the reference number 214. In various embodiments, the interfacial layer may be formed by chemical oxide technique, thermal oxide procedure, atomic layer deposition (ALD) or chemical vapor deposition (CVD). The high k dielectric material layer may be formed by CVD, ALD, plasma enhanced CVD (PECVD), or plasma enhanced ALD (PEALD). The cap layer can be formed using CVD with precursor silane ($SiH_4$) or other silicon based precursor.

Continuing with the present embodiment, a polycrystalline silicon (polysilicon) layer 216 is formed above the IL/HK/Cap layer 214. In the present embodiment, the polysilicon layer 216 is non-doped. The silicon layer 216 alternatively or additionally may include amorphous silicon. An oxide 218 is formed over the polysilicon layer 216, and a silicon nitride layer (SiN) 218 is formed over it, forming a hard mask (HM). It is understood that the formation, including patterning, of such layers is well known in the art, and will not be further discussed for the sake of brevity and clarity.

Figure 3:
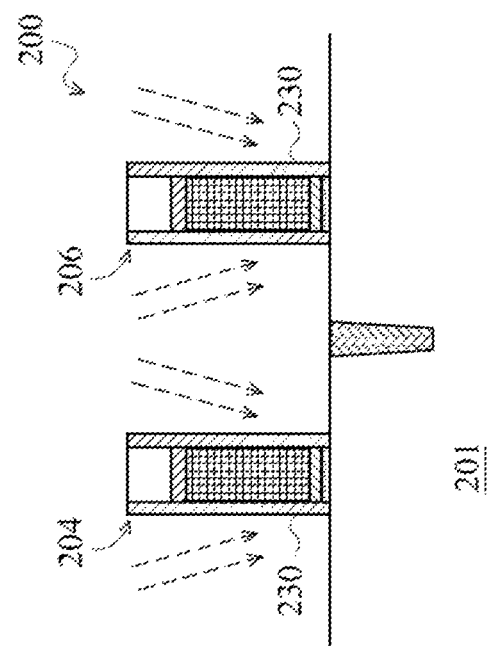
FIGS. 2-19 are sectional views of one embodiment of a semiconductor device having an n-type and p-type MOSFET (an NFET and PFET) with metal gate stacks, at various fabrication stages constructed according to the method of FIG. 1.

Referring to FIGS. 1 and 3, the method 100 proceeds to step 103, where a dielectric seal 230 is formed around the gate stacks 204, 206. In the present embodiment, the dielectric seal 230 is formed using atomic layer deposition to form a layer of SiN and/or other suitable dielectric material of approximately 50 Å thickness. In addition, the substrate 201 is doped to form halogen and light doped drain (LDD) regions for the source and drain (S/D) features. The source and drain regions are formed for the NFET and the PFET devices using proper doping species.

Figure 4:
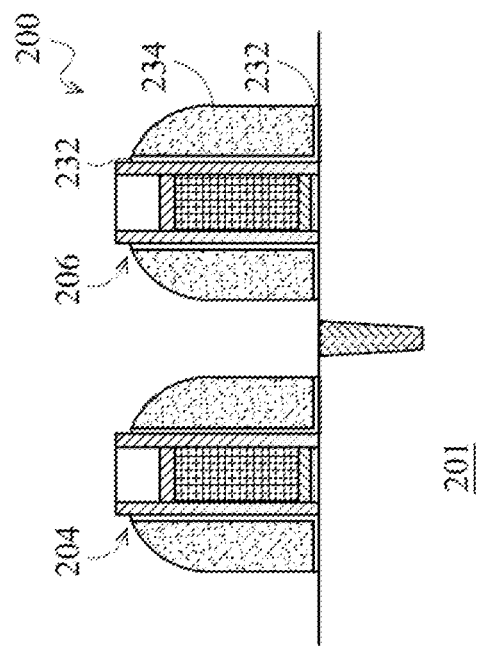

Referring to FIGS. 1 and 4, the method 100 proceeds to step 104, where a main side wall (MSW) is formed. The MSW includes a first sidewall layer 232 adjacent to the outer surface of the dielectric seal 230 and the upper surface of the substrate 201. In the present embodiment, the first sidewall layer 232 is formed by using ALD to form silicon oxide and/or other suitable dielectric to a thickness of about 30 A. The MSW also includes a second sidewall layer 234 formed on an outer surface of the first sidewall layer 232. In the illustrated embodiment, the second sidewall layer 235 includes SiN and/or other suitable dielectric formed to a maximum thickness of about 250 A. As shown in FIG. 4, the MSW is adjacent to the sidewalls of the polysilicon gate stacks 204, 206, and do not cover the entire substrate.

Figure 5:
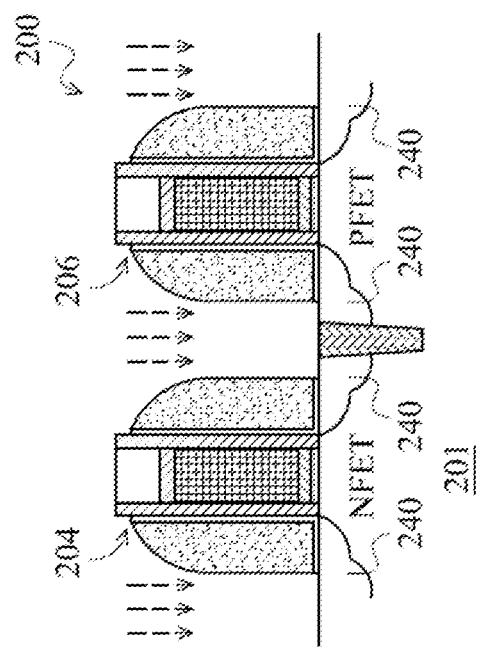

Referring to FIGS. 1 and 5, the method 100 proceeds to step 105, where S/D and electrostatic discharge regions 240 are fully implanted and activated. As mentioned above with respect to step 103, LDD regions were previously provided in the substrate 201 prior to the MSW being formed at step 104. At step 105, a deeper implantation process is performed. The doped regions for the NFET are doped with P-type dopants, such as boron or $BF_2$, and the doped regions for the PFET are doped with N-type dopants, such as phosphorus or arsenic. The doped regions 240 may be formed directly on the substrate 201, in a P-well structure, in an N-well structure, in a dual-well structure, or using a raised structure. In the present embodiment, the S/D activation is performed by a laser anneal (LSA) at about 1150 C, along with a rapid thermal anneal (RTA) with about a 1010 C spike.

Figure 6:
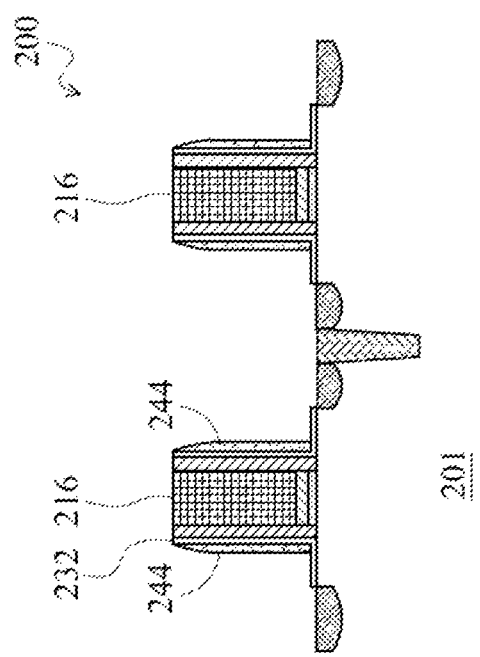

Referring to FIGS. 1 and 6, the method 100 proceeds to step 106, in which nickel silicide (NiSi) regions 242 are formed for future contacts to the S/D regions 240. In the present embodiment, Ni is deposited to a thickness of about 400 A in the substrate 201, guided by the MSW formed at step 105.

Figure 7:
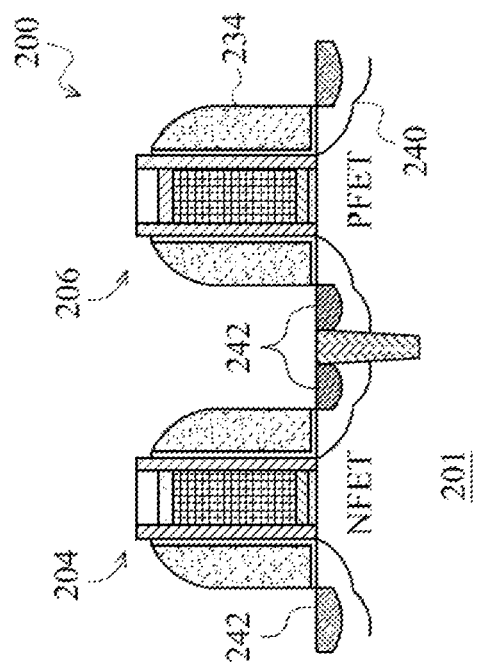

Referring to FIGS. 1 and 7, the method 100 proceeds to step 107, in which a portion of the second sidewall layer 234 of the MSWs is removed from the two gate stacks. As shown in FIG. 7, a portion of the second sidewall layer 234, now labeled 244, remains on the MSWs, as well as the first sidewall layer 232. In an embodiment, this removal process is performed by a wet etch using $H_3PO_4$ at about 120 C. In addition, the HM 218, 220 may be removed from the top portion of the polysilicon gate 216. In one such embodiment, the SiN of the second sidewall layer 234 and the semiconductor oxide of the HM 218, 220 are removed by a dry etch process.

Figure 8:
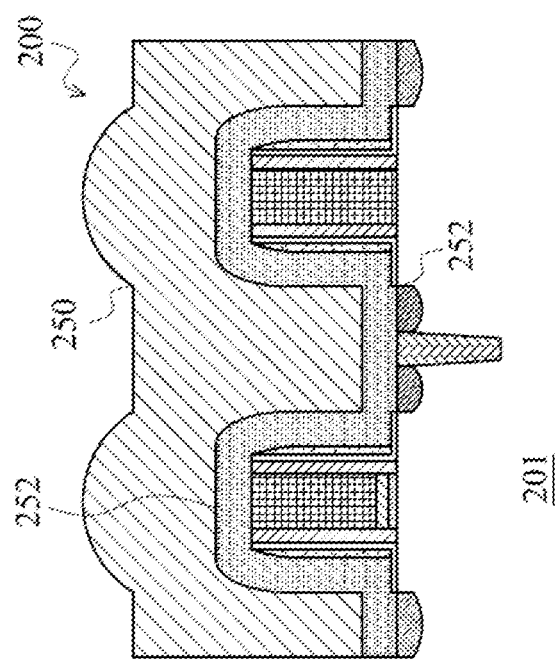

Referring to FIGS. 1 and 8, the method 100 proceeds to step 108, in which an interlayer dielectric (ILD) layer 250 is formed over the two gate stacks 204, 206. The ILD layer 250 may include a semiconductor oxide, a semiconductor nitride, a semiconductor oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, and/or combinations thereof. In the present embodiment, a tensile SiN contact etch stop layer 252 is deposited first, to a thickness of about 200 A. Thereafter, the ILD layer 250, phosphate silicate glass (PSG) in the present embodiment, is deposited to a thickness of about 2000 A using an ion plasma (IPM).

Figure 9:
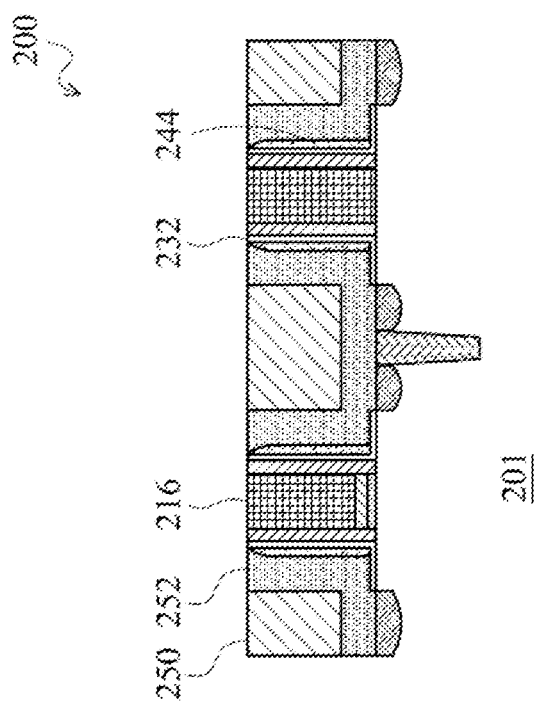

Referring to FIGS. 1 and 9, the method 100 proceeds to step 109, in which the upper surface of the device is planarized to expose the polysilicon gates 216. In the present embodiment, a chemical mechanical polishing process is performed.

Figure 10:
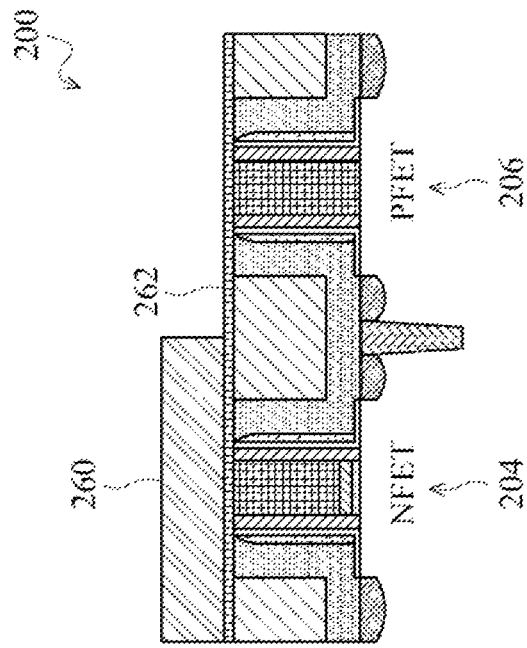

Referring to FIGS. 1 and 10, the method 100 proceeds to step 110, in which one of the two polysilicon gate stacks 204, 206 is masked. In the present embodiment, the polysilicon mask 216 for the NFET gate stack 204 is masked with a patterned photoresist (PR) layer 260. Specifically, a 20 A TiN hard mask 262 is deposited over a top surface of the device, and then the PR layer 260 is deposited over it. The PR layer 260 is patterned to mask the NFET gate stack 204.

Figure 11:
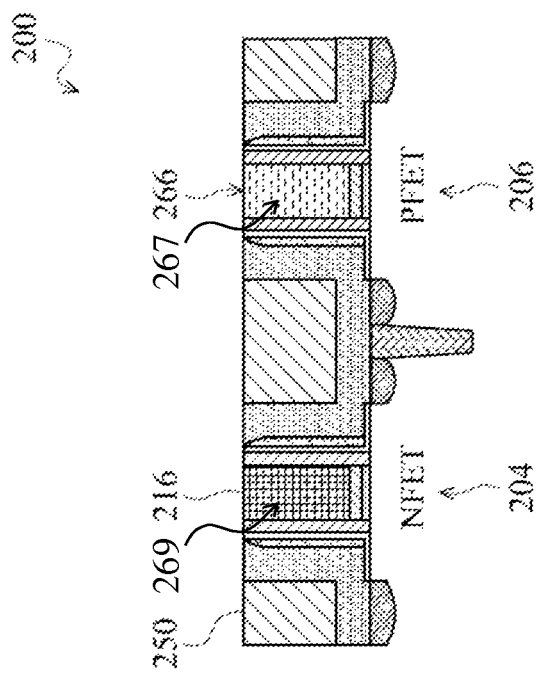

Referring to FIGS. 1 and 11, the method 100 proceeds to step 111, the polysilicon 216 in the PFET gate stack 206 is removed. In the present embodiment, the polysilicon 216 is removed via etching from the PFET gate stack 206 (which is now more accurately described as a trench than a gate stack), while the polysilicon in the NFET gate stack remains intact for being shielded by the patterned PR 260 in FIG. 10. Afterwards, a metal gate 266 is formed in the trench remaining from the removed polysilicon 216 in the PFET gate stack 206. The metal gate can be formed of one or more layers 267, and in the present embodiment, include the following deposited metals in order: TaN, TiN, TaN, TiN and Al (with trace amounts of Cu). The deposited metal layers 267 cover the entire surface of the device 200, but are then removed, including the PR 260, by a CMP process.

Figure 12:
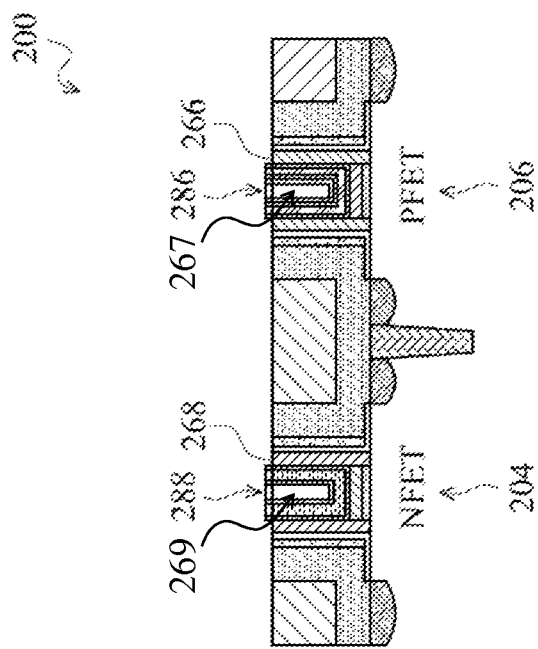
Figure 13:
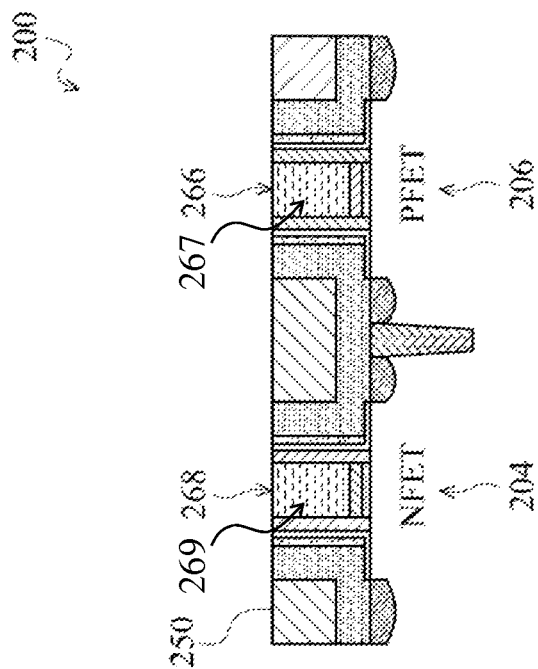

Referring to FIGS. 1, 12, and 13, the method 100 proceeds to step 112, in which a similar process is repeated on the NFET gate stack 204. In the present embodiment, since the polysilicon has already been removed and replaced on the PFET gate stack 206, a patterned PR layer covering the PFET gate stack is not used. The polysilicon 216 is removed from the NFET gate stack 204, such as by an etch process. Afterwards, a metal gate 268 is formed in the trench remaining from the removed polysilicon 216 in the NFET gate stack 204. The metal gate 268 can be formed of one or more layers 269, and in the present embodiment, include the following deposited metals in order: TaN, TiAl, TiN and Al (with trace amounts of Cu). The deposited metal layers 269 cover the entire surface of the device 200, but are then removed, including the PR 260, by a CMP process. As a result, both of the polysilicon gate stacks are now metal gate stacks 204, 206.

In the present embodiment, a film 286, 288 is formed over the metal gate stacks 204, 206. The film 286, 288 may include a conductive material such as a metal, metal oxide, metal nitride, metal oxynitride, compounds thereof, and/or other suitable materials. With specific reference to FIG. 13, in one embodiment, the film 286, 288 is an ultra-thin metal oxynitride film with a thickness of about 1 nm to about 10 nm is formed over the two gate stacks 266, 268, as disclosed in U.S. Ser. No. 61/530,845, which is hereby incorporated by reference. In other embodiments, the film operates as an etch stop layer for a subsequent etch process, discussed below with reference to FIG. 16.

Figure 14:
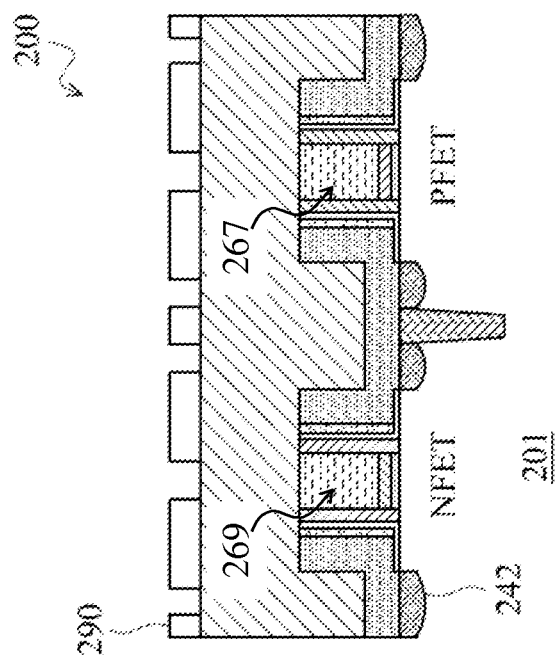

Referring to FIGS. 1 and 14, the method 100 proceeds to step 114, in which an ILD layer 290 is formed over the metal gate stacks 204, 206, including the ultra-thin metal oxynitride films 288, 286. ILD layer 290 may have a similar composition to ILD layer 250 or may include different materials and/or different arrangements. For example, the ILD layer 290 may include a semiconductor oxide, a semiconductor nitride, a semiconductor oxynitride, TEOS oxide, PSG, BPSG, FSG, carbon doped silicon oxide, Black Diamond®, Xerogel, Aerogel, amorphous fluorinated carbon, Parylene, BCB, SiLK, polyimide, other suitable materials, and/or combinations thereof. In the present embodiment, the ILD layer 290 is undoped silicate glass (USG) at a thickness of about 1450 Angstroms. The USG of the ILD 290 is formed by a deposition process at 400 C using SiH4/N2O/He. The ILD 290 can be formed on top of the ILD 250, or the ILD layer 250 can be removed, and/or an additional combinations of dielectric materials can be formed.

Figure 15:
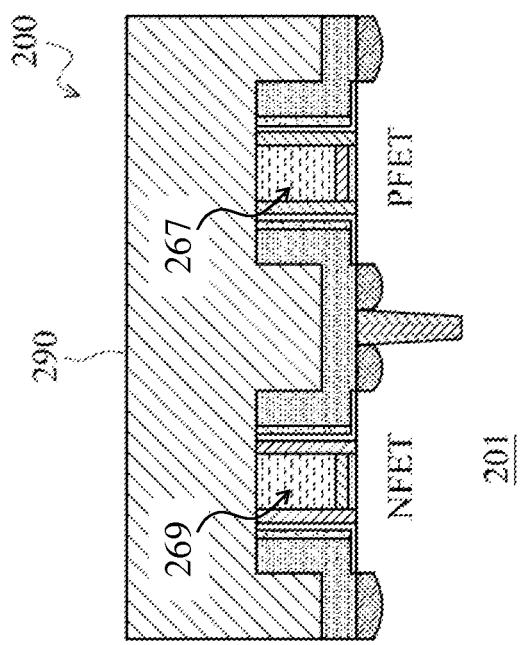

Referring to FIGS. 1 and 15, the method 100 proceeds to step 115, where a layer of photoresist (PR) 292 is applied to the top surface of the ILD layer 290. The PR 292 is patterned, such as by a photolithography or e-beam process, to form openings that correspond with trenches and contacts to be discussed further below.

Figure 16:
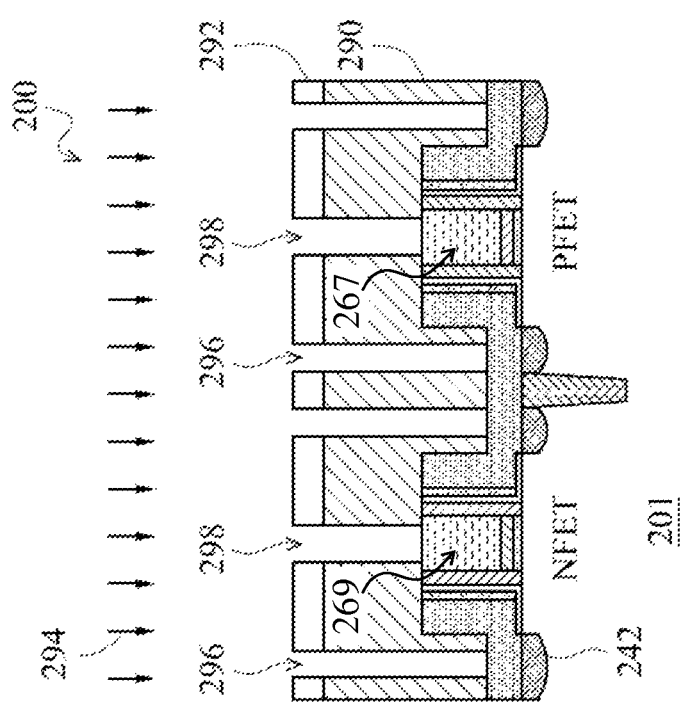

Referring to FIGS. 1 and 16, the method 100 proceeds to step 116 in which a first etch 294 is performed on the ILD layer 290 according to the patterned PR 292. The first etching process 294 may utilize a directional, or anisotropic, etching technique configured to etch vertically through the ILD layer 290 with minimal lateral etching. This produces vertical openings in the ILD layer 290 for subsequent contact formation. While an anisotropic etching technique is shown, the first etching process 294 may include any suitable anisotropic or isotropic etching technique including dry etching, wet etching, reactive ion etching RIE, and combinations thereof. Furthermore, the first etching process 294 may use any suitable etch chemistry or combination thereof. In such embodiments, the etchants and other etching parameters may be tuned so that the exposed material of the ILD layer 290 is removed without etching other materials such as the materials of the gate stacks 266 and 268 including metal layers 267, 269. For example, in the present embodiment, a dry, anisotropic plasma etch equipped with fluorine-containing gases, such as $CF_4$, $CH_2F_2$, or $C_4F_6$, is used. In order to achieve a proper etch profile and selectivity, the anisotropic plasma etch 294 may include multiple etch portions, such as a main etch, an over etch and a post etch treatment. In the illustrated embodiment, the dry etch 294 creates trenches 296, 298 with relatively vertical profiles that stop at the top surface of the gate stack 266, 268 and the substrate 201. In some embodiments, one or more etch-stop layers may have been previously applied to the substrate 201 to stop or slow-down the etch process.

Figure 17:
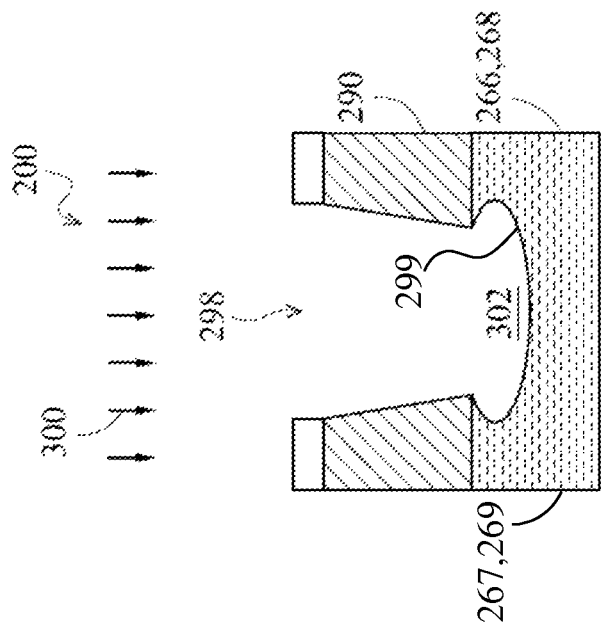

Referring to FIGS. 1 and 17, the method 100 proceeds to step 117 in which a second etch 300 is performed. The second etching process 300 may utilize a non-directional, or isotropic, etching technique configured to create a cavity including an undercut portion 302 in a layer of the gate stacks 266, 268, such as the metal layers 267, 269. In the illustrated embodiment, the undercut portion 302 has a substantially symmetrical curvilinear surface 299 and has its largest horizontal width (as measured parallel to the surface of the substrate 201) in an interior portion of the metal layers 267, 269 of the gate stacks 266, 268. This creates an overhang of the metal layers 267, 269 above the undercut portion 302, which provides increased contact area between the metal layers 267, 269 and a subsequently formed contact. The increased surface area may reduce resistivity at the contact interface and may also provide a more secure electrical connection. In addition to forming the undercut portion 302, the second etching process may also interact with the trenches 296, 298 to form a more tapered profile (see, e.g., FIG. 19).

While an isotropic etching technique is shown, the second etching process 300 may include any suitable anisotropic or isotropic etching technique including dry etching, wet etching, reactive ion etching RIE, and combinations thereof. Furthermore, the second etching process 300 may use any suitable etch chemistry or combination thereof. In such embodiments, the etchants and other etching parameters may be tuned so that certain materials of the gate stacks 266, 268 (such as the metal layers 267, 269) are etched without etching other materials such as the dielectric seal 230. For example, in the present embodiment, a wet, isotropic etch selective to the materials of the metal gate stacks 266, 268 is used. In the embodiment above with reference to TaN, TiAl, TiN and Al, the etchant includes a solution such as diluted APM ($NH_4OH$/$H_2O_2$/$H_2O$) solution in room temperature. In some embodiments, the patterned PR 292 is also removed before, during, or after the second etching process 300.

Figure 18:
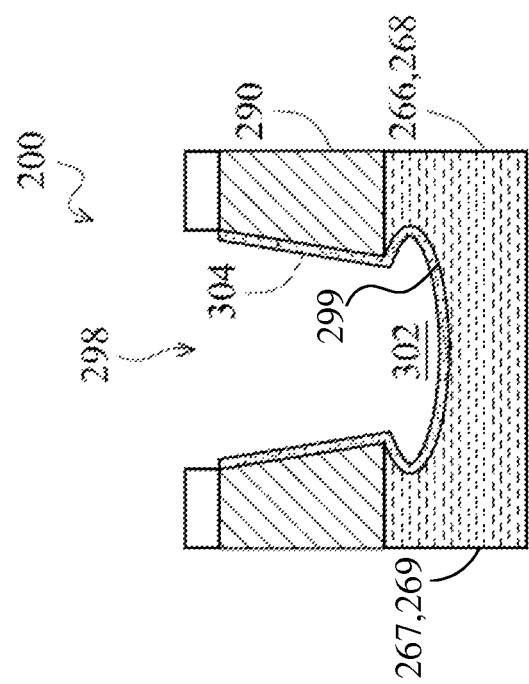

Referring to FIGS. 1 and 18, the method 100 proceeds to step 118 where a glue layer 304 (also referred to as an adhesion layer) is applied to the trenches 298, as well as the curvilinear surface 299 of the undercut portion 302. As the name implies, the glue layer 304 may be used to improve the quality of the interface between the metal layers 267, 269 and the conductor of the contact. Accordingly, the glue layer 304 may include one or more layers of conductive materials including metals (e.g., W, Al, Ta, Ti, Ni, Cu, Co, etc.) and metal nitrides, which may be deposited via ALD, CVD, PE CVD, PEALD, physical vapor deposition (PVD), and/or other suitable deposition process. In the present embodiment, the glue layer 304 includes multiple deposited layers of Ti and TiN. In other embodiments, one or more additional layers can be added, such as barrier layers.

Figure 19:
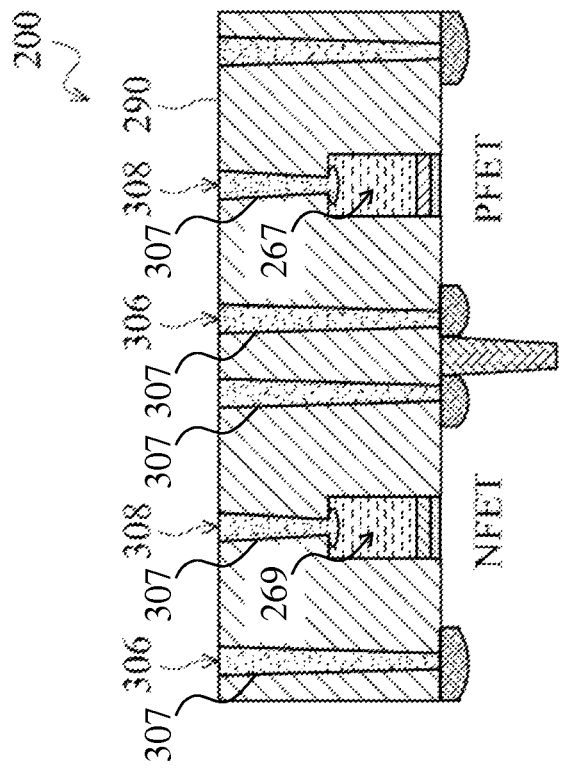

Referring to FIGS. 1 and 19, the method 100 proceeds to step 119 in which the trenches 296, 298 are filled with a contact fill material 307. The contact fill material 307 may include one or more layers of any suitable conductive materials including metals (e.g., W, Al, Ta, Ti, Ni, Cu, etc.), metal oxides, metal nitrides, and/or combinations thereof. For example, the contact fill material 307 may contain a barrier layer that includes W, Ti, TiN, Ru, or combinations thereof and a Cu-containing fill material disposed on the barrier layer. In another embodiment, the contact material 307 includes tungsten, which is deposited over the device 200 with or without a barrier layer. Yet another embodiment includes a cobalt contact material 307. The contact fill material 307 may be deposited by any suitable technique including PVD (e.g., sputtering), CVD, PE CVD, ALD, PEALD, and/or combinations thereof. A planarization process can be performed to remove portions of the contact material that is above the ILD layer 290, resulting in S/D contacts 306 and gate contacts 308.

The present embodiments discussed above provides many benefits, it being understood that other embodiments may not have the same benefits. The benefits of the embodiments discussed above include increased surface contact between the gate contact 308 and the corresponding metal gate stacks 266, 268. By having increased surface contact, it has been found that the contact resistance there between is reduced.

Figure 20:
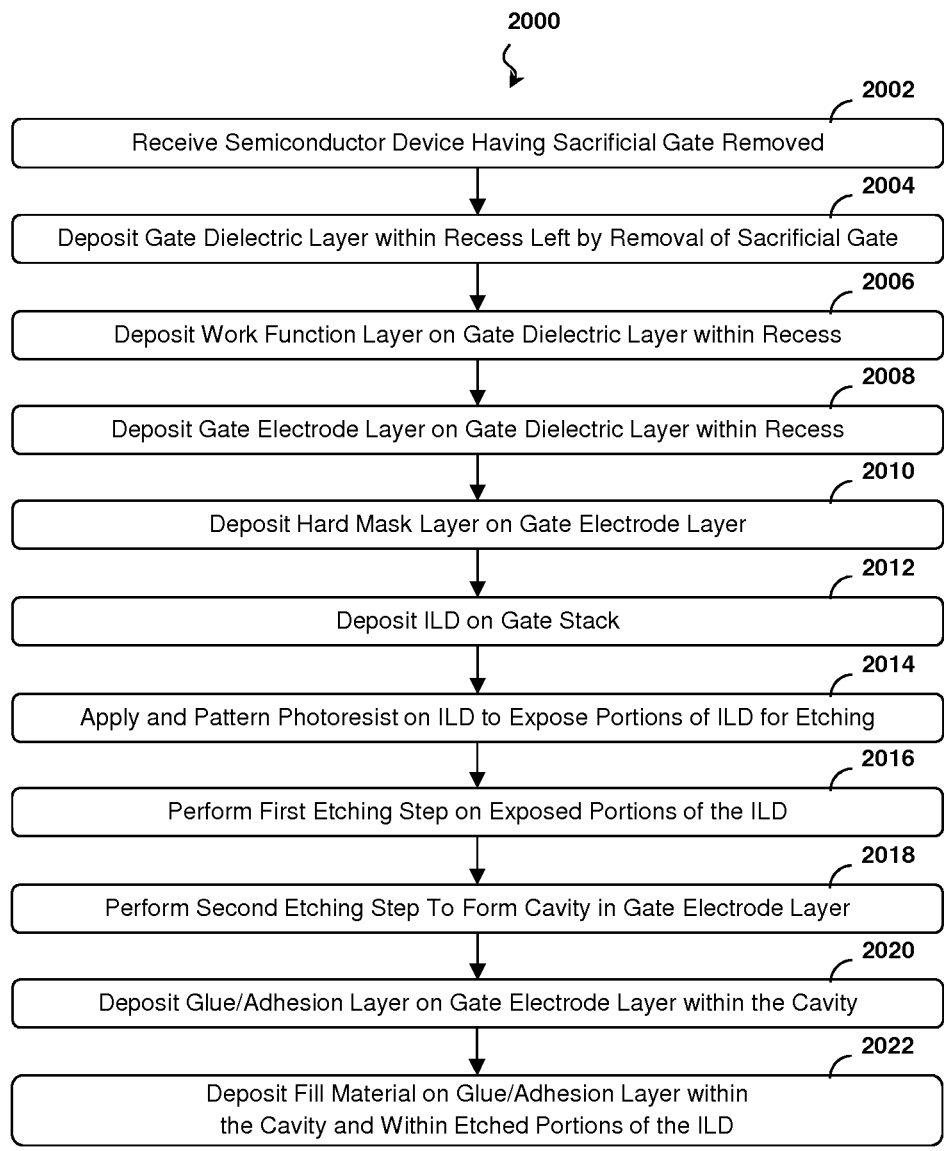
FIG. 20 is a flowchart of a method of fabricating a semiconductor device according to various embodiments of the present invention.

The technique of the present disclosure is also suitable for use with other gate stack configurations. For example, FIGS. 20-27B illustrate another example of the semiconductor device 2100 undergoing the method of forming undercut contacts. FIG. 20 is a flowchart of a method 2000 of fabricating the semiconductor device 2100 according to aspects of the present disclosure. It is understood that additional steps can be provided before, during, and after the method 2000 and that some of the steps described can be replaced or eliminated for other embodiments of the method. FIGS. 21-27B are cross-sectional views of a semiconductor device 2100 undergoing the fabrication method 2000 according to various aspects of the present disclosure. FIGS. 21-27B have been simplified for the sake of clarity and to better illustrate the concepts of the present disclosure.

Referring to FIG. 21 and to block 2002 of FIG. 20, a semiconductor device 2100 is received. In many aspects, the semiconductor device 2100 is substantially similar to the semiconductor structure 200 of FIGS. 2-19. For example, the semiconductor device 2100 may include a substrate 201, one or more isolation features 202, source/drain (S/D) regions 240, an interfacial layer 2102, a dielectric seal 230, a first sidewall layer 232, a second sidewall layer 234, and an ILD layer 250 each substantially similar to those of FIGS. 2-19. However, in contrast to the previous embodiments, the gate dielectric layer 2204 and/or the work function layer 2206 is formed after the sacrificial polysilicon gate 216 is removed rather than before.

Referring to FIG. 21, removing the polysilicon gate 216 leaves a recess defined by one or more of the dielectric seal 230, the sidewall layers 232 and 234, and/or the ILD layer 250. The removal of the polysilicon gate layer 216 may be performed using the technique of steps 110-112 of method 100 or by any other suitable replacement gate technique. The replacement gate stack 2202 is formed in the recess as shown in FIG. 22.

Referring to block 2004 of FIG. 20 and to FIG. 22, a gate dielectric layer 2204 is formed on the interfacial layer 2102 in the recess. In the illustrated embodiment, the gate dielectric layer 2204 also extends along the vertical surfaces of the dielectric seal 230 such that the portions of the gate dielectric layer 2204 on the vertical surfaces extend above the portions of the gate dielectric layer 2204 formed on the interfacial layer 2102. This forms a U-shaped structure. In some embodiments, a highly-conformal deposition technique such as CVD or ALD is used to deposit the gate dielectric layer 2204 in the U-shaped configuration, although non-conformal deposition techniques may also be used. In these embodiments and others, suitable deposition processes include CVD, high-density plasma CVD (HDP-CVD), ALD, PVD, spin-on deposition, and/or other suitable deposition processes. Suitable materials for the gate dielectric layer 2204 are commonly characterized by their dielectric constant relative to silicon oxide. The gate dielectric layer 2204 may be substantially similar to the high-k dielectric layer (HK) of FIGS. 2-19 and may include a high-k dielectric material such as $HfO_2$, HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric layer 2204 may include other dielectrics such as silicon dioxide, silicon nitride, silicon oxynitride, silicon carbide, amorphous carbon, tetraethylorthosilicate (TEOS), other suitable dielectric material, and/or combinations thereof.

Referring to block 2006 of FIG. 20 and to FIG. 22, one or more work function layers 2206 may be formed on the gate dielectric layer 2204 in the recess. The work function layers 2206 may be limited to the bottommost portion of the gate dielectric layer 2204. Alternately, such as in the illustrated embodiment, the work function layer 2206 also extends along the vertical surfaces of the gate dielectric layer 2204 to form a U-shaped structure within the U-shaped structure of the gate dielectric layer 2204. Suitable work function metal gate materials include n-type and/or p-type work function materials based on the type of device to which the gate stack corresponds. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. In various embodiments, the work function layers 2206 are deposited by CVD, ALD, PVD, and/or other suitable processes.

Referring to block 2008 of FIG. 20 and to FIG. 22, a gate electrode layer 2208 is formed on the gate dielectric layer 2204 and the work function layer 2206 (if present). The gate electrode layer 2208 may include any suitable conductive material including polysilicon, Al, Cu, Ti, Ta, W, Mo, TaN, $NiSi_2$, cobalt silicide, TiN, WN, TiAl, TiAlN, TaCN, TaC, TaSiN, metal alloys, other suitable materials, and/or combinations thereof. In the illustrated embodiments, the gate electrode layer 2208 is different in composition from the work function layer 2206. For example, an Al or Cu-containing gate electrode layer 2208 may be used with a Ti-containing work function layer 2206. The difference in composition may be used to selectively etch the gate electrode layer 2208 without etching the work function layer 2206 as described in more detail below. The gate electrode layer 2208 may be deposited by CVD, ALD, PVD (e.g., sputtering), and/or other suitable processes. A CMP process may follow the deposition of the gate electrode layer 2208 to planarize the top surface of the gate electrode layer 2208 and to remove any electrode material extending outside of the recess.

Referring to block 2010 of FIG. 20 and to FIG. 22, an optional hard mask layer 2210 may be formed on the gate electrode layer 2208 to insulate the gate electrode layer 2208 and to protect it during subsequent processing. The hard mask layer 2210 may also function as an etch stop layer. Accordingly, the hard mask layer 2210 may include one or more layers of any suitable dielectric such as a semiconductor oxide, a semiconductor nitride, a semiconductor oxynitride, and/or a semiconductor carbide. In one such embodiments, the hard mask layer 2210 includes SiN. Additionally or in the alternative, the hard mask layer 2210 may include one or more layers of a conductive material substantially similar to that of films 286 and 288 of FIGS. 2-19. Suitable conductive materials include metal, metal oxide, metal nitride, metal oxynitride, compounds thereof, and/or other suitable materials. In an embodiment, the hard mask layer 2210 includes a layer of a conductive material adjacent to the gate electrode layer 2208 and a layer of a dielectric material opposite the layer of conductive material. The hard mask layer 2210 may be deposited by any suitable deposition technique including CVD, ALD, PVD, and/or other suitable processes. In one example, the deposition includes a controlled etching of the gate electrode layer 2208 that creates a recess in the gate stack 2202 in which the hard mask layer 2210 is deposited.

An ILD layer 290 is formed over the gate stack 2202, and may be substantially similar to the ILD layer 290 of FIGS. 2-19. In that regard, ILD layer 290 includes any suitable dielectric, such as a semiconductor oxide, a semiconductor nitride, a semiconductor oxynitride, TEOS oxide, phosphosilicate glass (PSG), other suitable materials, and/or combinations thereof and may be substantially similar in composition to ILD layer 250 or may include different materials and/or different arrangements. ILD layer 290 may exhibit an etchant sensitivity that is different from surrounding etch stop materials such as the hard mask layer 2210. For example, silicon oxide is more sensitive to buffered hydrofluoric acid than silicon nitride, whereas silicon nitride is more sensitive to phosphoric acid than silicon oxide. The ILD layer 290 may be formed by any suitable technique including those described in step 114 of method 100.

Figures 23, 24:
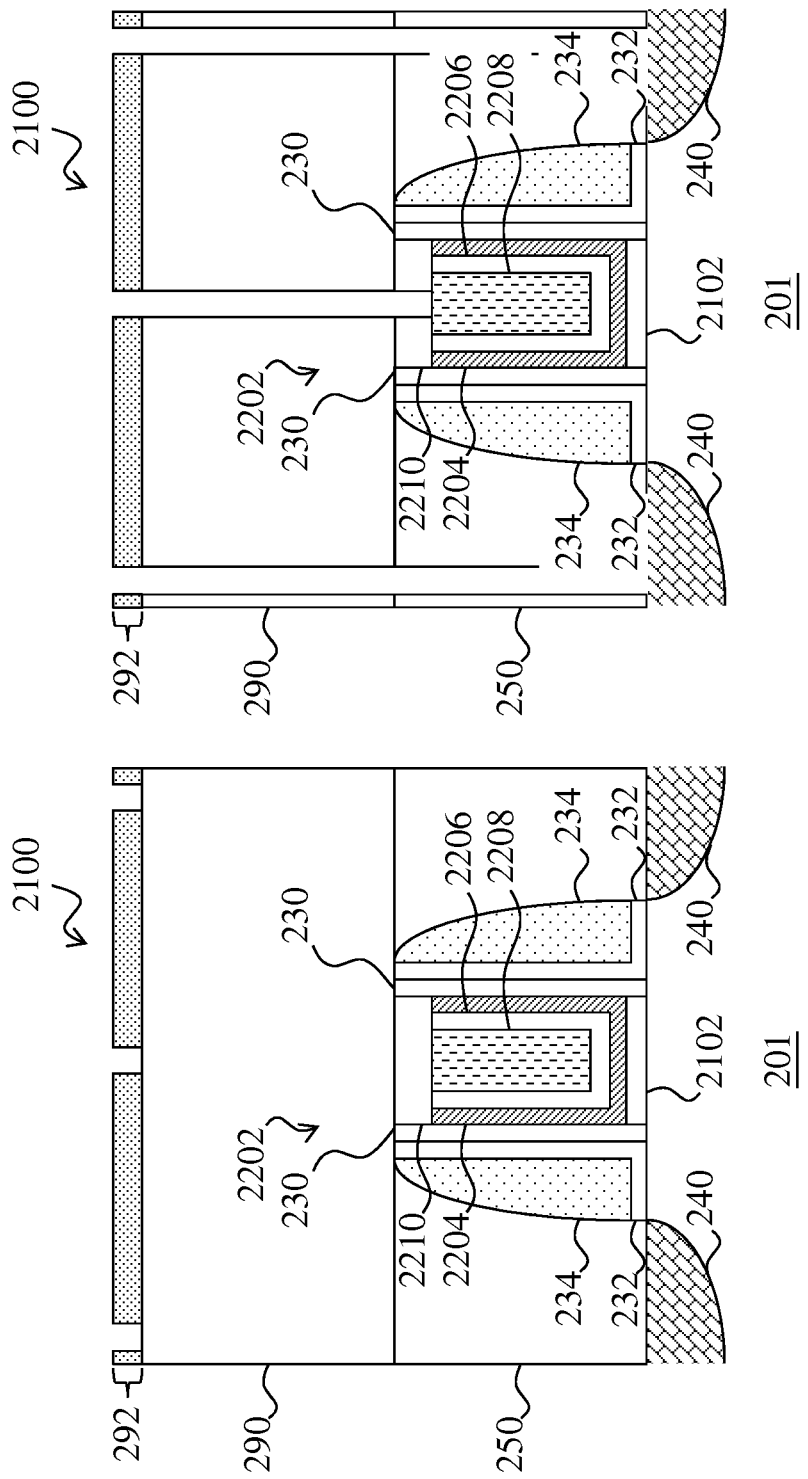

Referring to block 2014 of FIG. 20 and to FIG. 23, a layer of photoresist 292 is applied to the top surface of the ILD layer 290 and patterned to form openings exposing regions of the ILD layer 290 to be etched. This may be performed substantially as described in step 115 of FIG. 1. Referring to block 2016 of FIG. 20 and to FIG. 24, a first etching technique 294 using a first etching chemistry is performed on the ILD layers 250 and 290 in order to etch portions of the ILD layers 250 and 290 exposed by the photoresist 292. The first etching process 294 may be performed substantially as described in step 116 of FIG. 1 and may include any suitable anisotropic or isotropic etching technique including dry etching, wet etching, reactive ion etching RIE, and combinations thereof. In the illustrated embodiment, the first etching process 294 utilizes an anisotropic etching technique configured to etch vertically through the ILD layer 290 with minimal lateral etching. As can be seen, the first etching process 294 exposes the gate electrode layer 2208 through the ILD layer 290. This may include etching through the hard mask layer 2210 if one is included in the gate stack 2202. The etching of the ILD layer 290 and the hard mask layer 2210 may be controlled by adjusting the etching technique, the etchant, and/or other etching parameters. In the present embodiment, a dry anisotropic plasma etch equipped with fluorine-containing gases, such as $CF_4$, $CH_2F_2$, or $C_4F_6$, is used. In order to achieve a proper etch profile and selectivity, the anisotropic etch 294 may include multiple etch portions, such as a main etch, an over etch and a post etch treatment.

Referring to block 2018 of FIG. 20 and to FIG. 25A, a second etching process 300 is performed substantially as described in step 117 of FIG. 1 in order to create a cavity in the gate electrode layer 2208. The second etching process 300 may utilize a non-directional, or isotropic, etching technique configured to create the cavity so that it includes an undercut portion 302 in the gate electrode layer 2208. In the illustrated embodiment, the undercut portion 302 has a substantially symmetrical curvilinear surface 299 and has its largest horizontal width (as measured parallel to the surface of the substrate 201) in an interior portion of the gate electrode layer 2208. This creates an overhang of the gate electrode material above the undercut portion 302, which provides increased contact area between the gate electrode layer 2208 and a subsequently formed contact. The increased surface area may reduce resistivity at the contact interface and may also provide a more secure electrical connection. In addition to forming the undercut portion 302, the second etching process may also interact with the ILD layers 250 and 290 to taper the profile of the contact openings.

While an isotropic etching technique is shown, the second etching process 300 may include any suitable anisotropic or isotropic etching technique including dry etching, wet etching, reactive ion etching RIE, and combinations thereof. Likewise, the second etching process 300 may use any suitable etch chemistry or combination thereof, and in some embodiments, the etchants and other etching parameters are be tuned so that the gate electrode layer 2208 is etched without etching the work function layer 2206 and/or the gate dielectric layer 2204. Referring to FIG. 25B, this etchant selectivity may prove especially useful when the contact openings are misaligned, which may commonly occur alongside the embodiments of FIG. 25A. In other words, the same method 2000 may produce the embodiments of FIG. 25B and FIG. 25A at the same time and on the same substrate 201. In such embodiments, the curvilinear surface 299 of the resulting undercut portion 302 may be interrupted by an interface with the work function layer 2206 and/or the gate dielectric layer 2204, but solid electrical contact can still be maintained. In the illustrated embodiment, the second etching exposes the work function layer 2206 without etching it. Accordingly, the surface 299 has a substantially planar portion at the interface with the work function layer 2206, and the undercut portion 302 does not extend into the work function layer 2206. The patterned photoresist 292 may be removed before, during, or after the second etching process 300.

Figure 26:
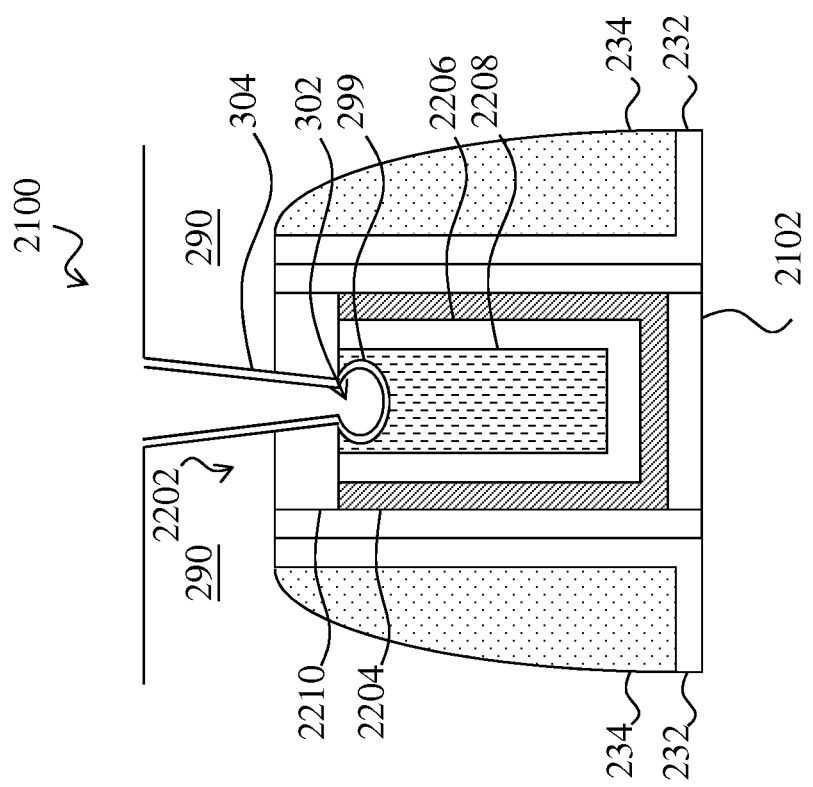
Figure 27:
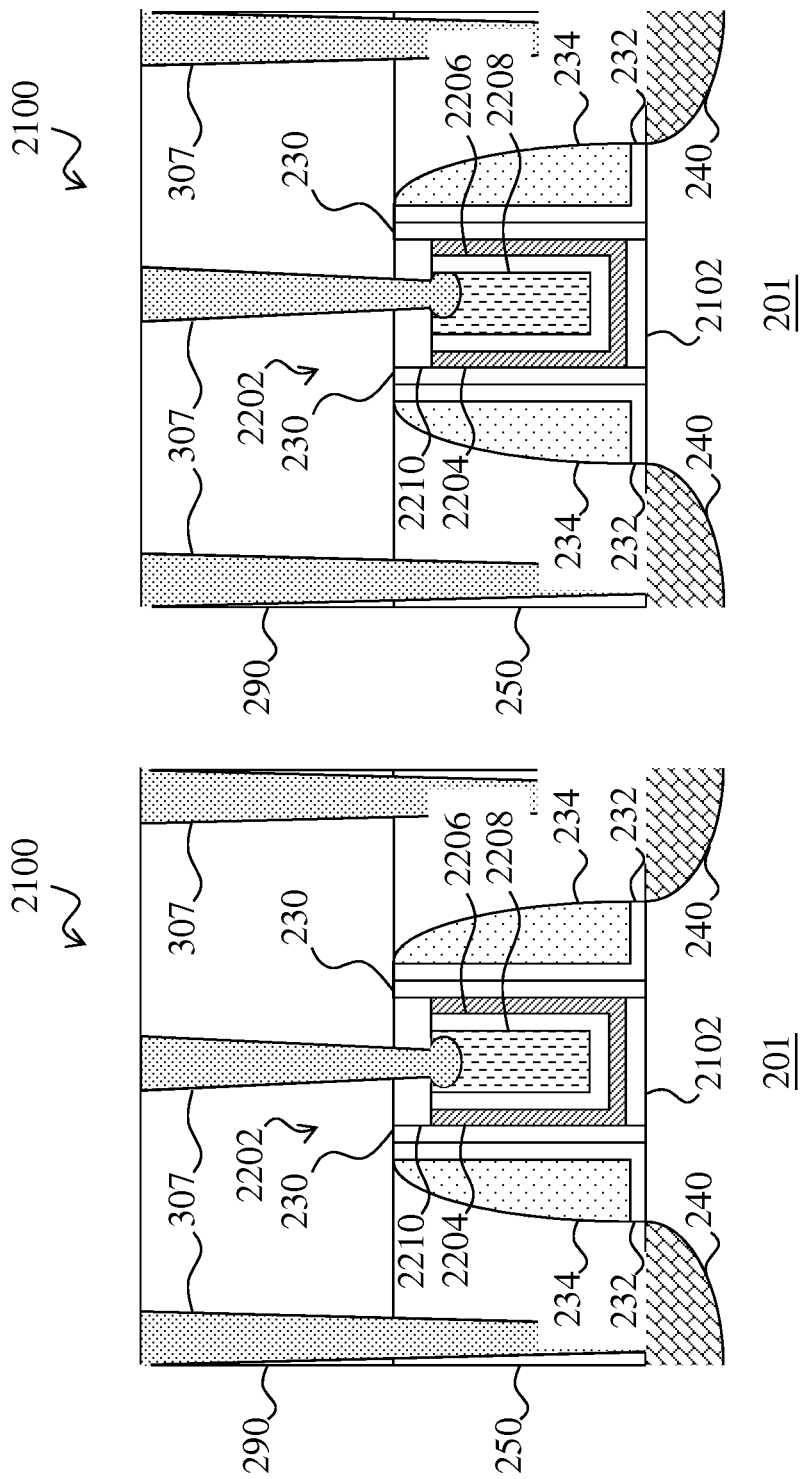

Referring to block 2020 of FIG. 20 and to FIG. 26, a glue layer or adhesion layer 304 is deposited on the ILD layer 290, on the curvilinear surface 299 of the undercut portion 302, and on the hard mask layer 2210 if the gate stack 2202 so includes. The glue layer 304 may include one or more layers of conductive materials including metals, metal alloys, other metal compounds, non-metallic conductors, and/or combinations thereof, which may be deposited via ALD, CVD, PE CVD, PEALD, PVD, and/or other suitable deposition process substantially as described in step 118 of FIG. 1. In the present embodiment, the glue layer 304 includes multiple deposited layers of Ti and TiN.

Referring to block 2022 of FIG. 20 and to FIG. 27A the trenches are filled with a contact fill material 307, which may be performed substantially as described in step 119 of FIG. 1. The deposited contact fill material 307 extends through the ILD layers 250 and 290 to form contacts to the gate stack 2202 as well as to the source/drain (S/D) regions 240. Because of the undercut portion 302, the gate electrode layer 2208 surrounds the contact fill material 307, and at least some of the gate electrode layer 2208 is disposed on top of the contact fill material 307 (opposite the substrate). This increases the surface area between the gate electrode layer 2208 and the contact fill material 307 and may improve the electrical connection therebetween.

The contact fill material 307 may include one or more layers of any suitable conductive materials including metals, metal alloys, other metal compounds, non-metallic conductors, and/or combinations thereof. In one such embodiment, the contact fill material 307 includes a barrier layer that includes W, Ti, TiN, or Ru and includes a Cu-containing fill material disposed on the barrier layer. In another embodiment, the contact fill material 307 includes tungsten with or without a barrier layer. The contact fill material 307 may be deposited by any suitable technique including PVD (e.g., sputtering), CVD, PE CVD, ALD, PEALD, and/or combinations thereof. Deposition may be followed by a CMP process to remove contact fill material 307 extending beyond the ILD layer 290.

By selecting an etchant for the second etching process 300 that does not etch the work function layer 2206 or the gate dielectric layer 2204, variations in device performance caused by misaligned contacts can be dramatically reduced. As can be seen in FIG. 27B, the resulting contact remains completely within the gate electrode layer 2208 even if the contact is misaligned. While the glue layer 304 or the contact fill material 307 may physically contact the work function layer 2206 or the gate dielectric layer 2204, because these layers remain intact, the performance of the resulting device is not impacted. It is understood that the misaligned embodiments of FIG. 27B frequently occur on the same substrate 201 as the properly aligned embodiments of FIG. 27A as interlayer alignment may not be guaranteed throughout the substrate 201.

Figure 28:
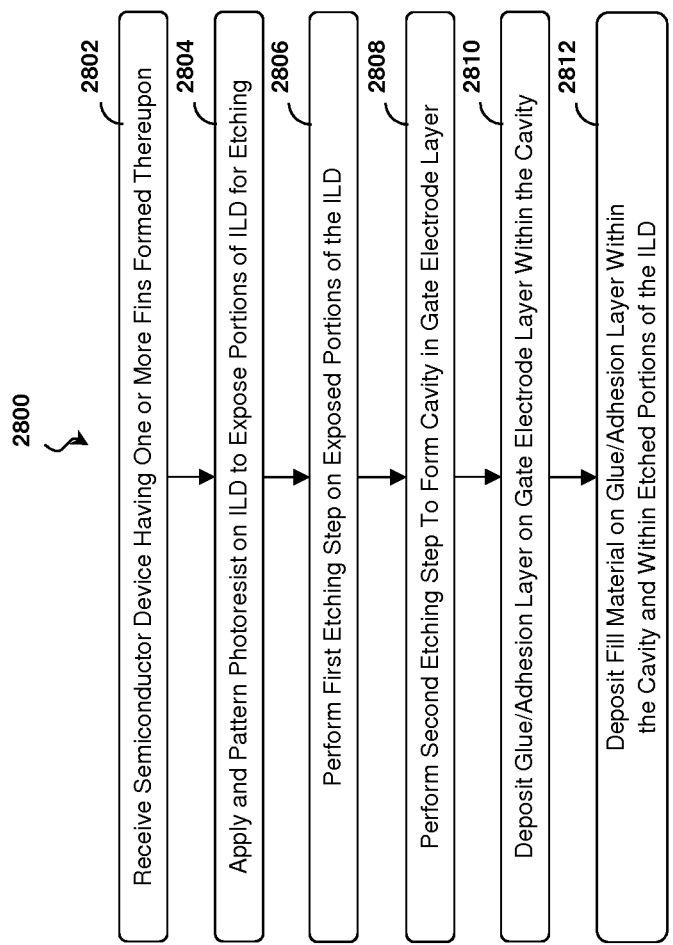
FIG. 28 is a flowchart of a method of fabricating a semiconductor device that includes one or more fin-based devices according to various embodiments of the present invention.
Figure 29:
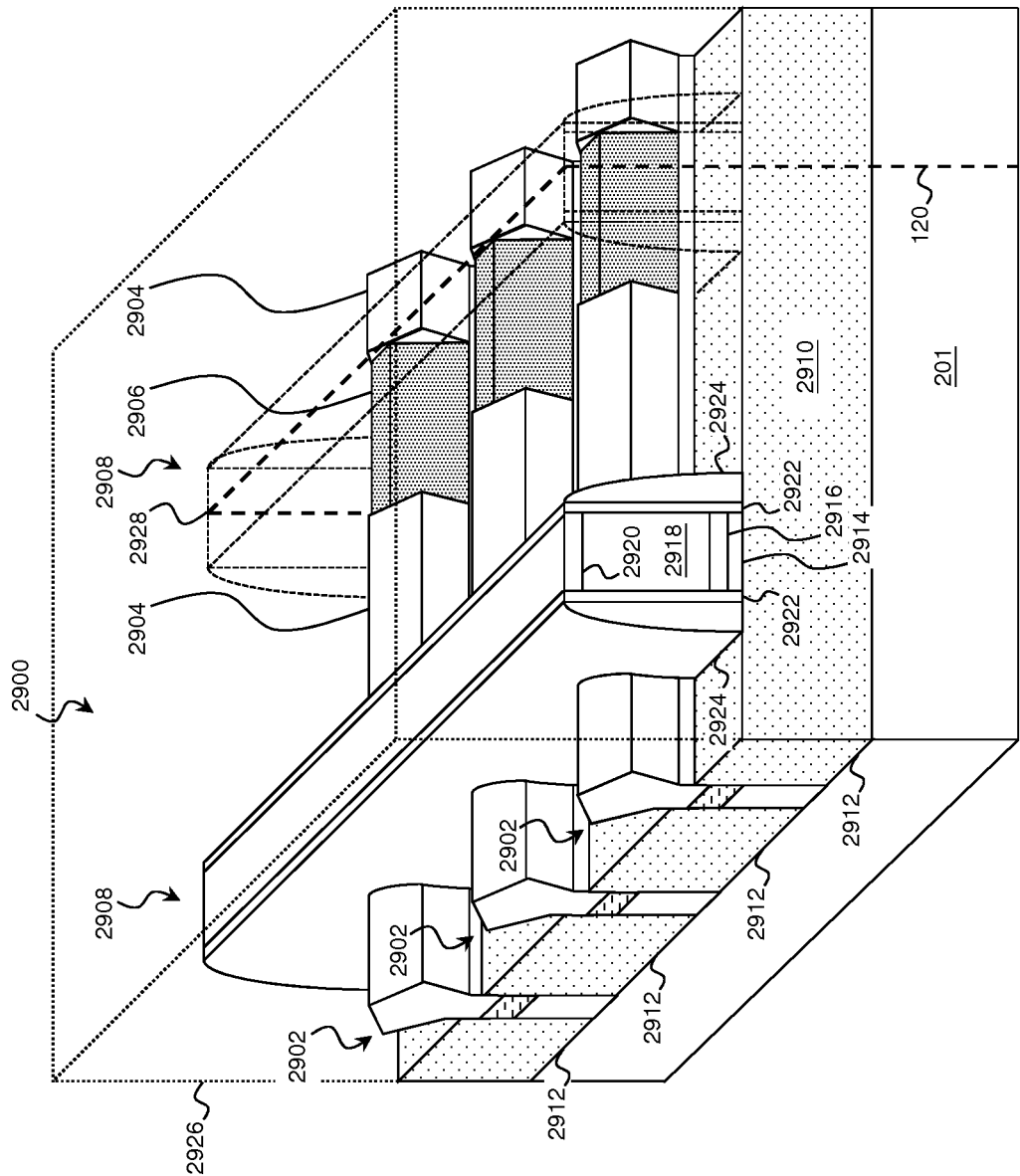
FIG. 29 is a perspective view of the semiconductor device including the fin-based device according to various embodiments of the present invention.
Figure 31:
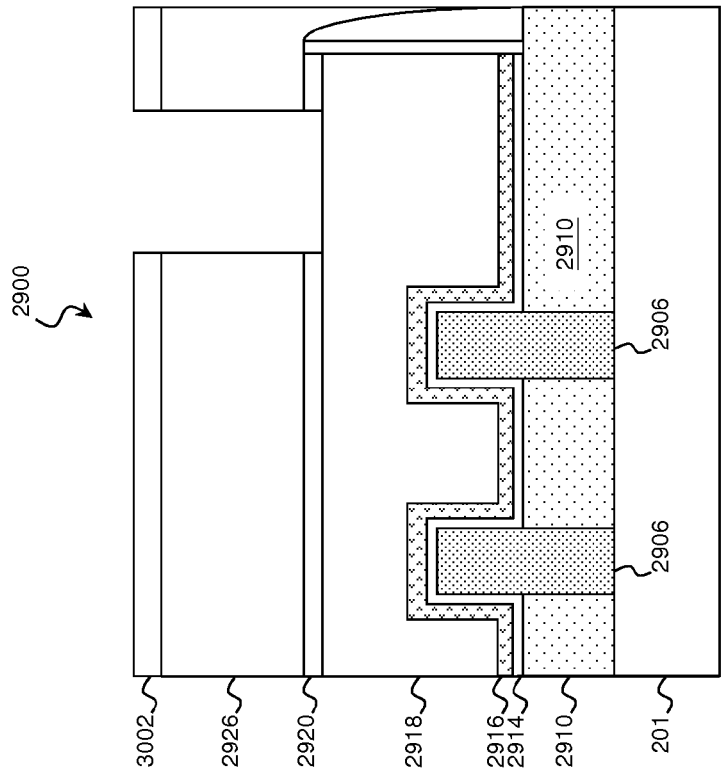
FIGS. 30-34 are cross-sectional views of the semiconductor device undergoing the method of FIG. 28 according to various embodiments of the present invention.
Figure 30:
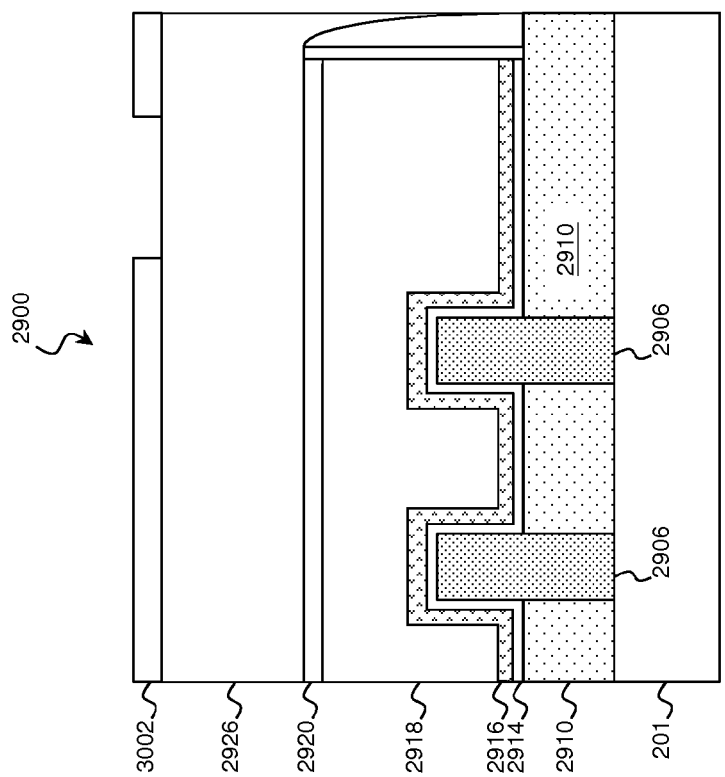

In addition to being well suited for fabricating contacts to a variety of planar devices, the technique of the present disclosure may also be applied to form contacts to FinFETS and other non-planar devices. An example of such an application is described with reference to FIGS. 28-34. FIG. 28 is a flow diagram of a method 2800 for fabricating a semiconductor device 2900 that includes one or more fin-based devices according to various aspects of the present disclosure. It is understood that additional steps can be provided before, during, and after the method 2800 and that some of the steps described can be replaced or eliminated for other embodiments of the method. FIG. 29 is a perspective view of the semiconductor device 2900 undergoing the fabrication method 2800 according to various aspects of the present disclosure. FIGS. 30-34 are cross-sectional views of a portion of the semiconductor device 2900, where the cross-section is taken through the channel region 2906 (along plane 2928), according to various aspect of the present disclosure. FIGS. 29-34 have been simplified for the sake of clarity and to better illustrate the concepts of the present disclosure.

Referring to block 2802 of FIG. 28 and to FIG. 29, the semiconductor device 2900 is received and includes a substrate 201 or wafer with one or more fin structures 2902 formed upon it. The fin structures 2902 are representative of any raised feature, and while the illustrated embodiments include FinFET fin structures 2902, further embodiments include other raised active and passive devices formed upon the substrate 201. The illustrated fin structures 2902 each comprise a pair of opposing source/drain regions 2904, which may include various doped semiconductor materials, and a channel region 2906 disposed between the source/drain regions 2904. The flow of carriers (electrons for an n-channel device and holes for a p-channel device) through the channel region 2906 is controlled by a voltage applied to a gate stack 2908 adjacent to and overwrapping the channel region 2906. One of the gate stacks 2908 is shown as translucent to better illustrate the underlying channel region 2906. In the illustrated embodiment, the channel region 2906 rises above the plane of the substrate 201 upon which it is formed, and accordingly, the fin structure 2902 may be referred to as a "non-planar" device. The raised channel region 2906 provides a larger surface area proximate to the gate stack 2908 than comparable planar devices. This strengthens the electromagnetic field interactions between the gate stack 2908 and the channel region 2906, which may reduce leakage and short channel effects associated with smaller devices. Thus in many embodiments, FinFETs and other nonplanar devices deliver better performance in a smaller footprint than their planar counterparts.

The elements of the semiconductor device 2900 will now be described in additional detail. Substrate 201 may be substantially similar to the substrate 201 of FIGS. 2-19 and may include any suitable semiconductor and non-semiconductor material. For example, the substrate 201 may include one or more layers of an elementary semiconductor, such as silicon or germanium; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, calcium fluoride ($CaF_2$); other suitable materials; and/or combinations thereof.

The substrate 201 may include isolation features 2910 disposed between the fin structures 2902. Similar to the isolation features 202 of FIGS. 2-19, the isolation features 2910 may include a liner (not shown) and a fill material 2912. The liner reduces crystalline defects at the interface between the substrate 201 and the dielectric fill material and may include any suitable material including a semiconductor nitride, a semiconductor oxide, a thermal semiconductor oxide, a semiconductor oxynitride, a polymer dielectric, and/or other suitable materials, and may be formed using any suitable deposition process including thermal growth, ALD, CVD, HDP-CVD, PVD, and/or other suitable deposition processes. In some embodiments, the liner includes a conventional thermal oxide liner formed by a thermal oxidation process. In further exemplary embodiments, the liner includes a semiconductor nitride formed via HDP-CVD. The fill material 2912 is disposed on the liner within the isolation features. Suitable fill materials 2912 include semiconductor oxides, semiconductor nitrides, semiconductor oxynitrides, FSG, low-K dielectric materials, and/or combinations thereof. In various exemplary embodiments, the fill material 2912 is deposited using a HDP-CVD process, a sub-atmospheric CVD (SACVD) process, a high-aspect ratio process (HARP), and/or a spin-on process. In one such embodiment, a CVD process is used to deposit a flowable dielectric material that includes both a dielectric fill material 2912 and a solvent in a liquid or semi-liquid state. A curing process is used to drive off the solvent, leaving behind the dielectric fill material 2912 in its solid state.

The fin structures 2902 are formed on the substrate 201 by recessing surrounding portions of the substrate 201 and leaving the fin structures 2902 and/or by depositing material to grow the fin structures 2902 on the substrate 201. After a gate stack 2908 is formed to protect the channel regions 2906 of the fin structures, additional semiconductor material may be added to the source/drain regions 2904 of the fin structure 2902. In many embodiments, the additional material is deposited by one or more epitaxy or epitaxial (epi) processes, whereby Si features, SiGe features, and/or other suitable features are grown in a crystalline state on the fin structure 2902. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The material of the source/drain regions 2904 may be in-situ doped during the epitaxy process by introducing doping species including: p-type dopants, such as boron or $BF_2$; n-type dopants, such as phosphorus or arsenic; and/or other suitable dopants including combinations thereof. If the source/drain regions 2904 are not in-situ doped, an implantation process (i.e., a junction implant process) is performed to dope the regions 2904.

The gate stacks 2908 are formed on top of the fin structures 2902 and may include an interfacial layer 2914, a gate dielectric layer 2916, a gate electrode layer 2918, and an optional capping layer 2920 disposed on and overwrapping the channel region 2906 of the fin structures 2902. Each of these elements may be substantially similar to their planar device counterparts described in FIGS. 2-19. For example, the interfacial layer 2914 may include an oxide, HfSiO, a nitride, an oxynitride, and/or other suitable material and may be deposited by any suitable method, such as thermal oxidation, ALD, CVD, ozone oxidation, etc. The gate dielectric layer 2916 may include any suitable dielectric such as a high-k dielectric material including: LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials. The gate dielectric layer 2916 may be deposited on the interfacial layer 2914 by any suitable technique, such as ALD, CVD, metal-organic CVD (MOCVD), PVD, thermal oxidation, combinations thereof, and/or other suitable techniques.

The gate electrode layer 2918 is disposed on the gate dielectric layer, and in various examples, contains polysilicon, metals, metal alloys, metal compounds, and/or non-metallic conductors. Suitable metals include Ti, Ag, Al, TiAlN, TaC, TaCN, TaSiN, Mn, Zr, TiN, TaN, Ru, Mo, Al, WN, Cu, W, and/or any suitable materials. In some embodiments, different gate materials are used for nMOS and pMOS devices. In some embodiments, the gate electrode layer 2918 has a multilayer structure that includes one or more of a metal layer, a liner layer, a wetting layer, and/or an adhesion layer.

An optional capping layer 2920 may be formed on the gate electrode layer 2918 to protect it during subsequent processing. In some embodiments, the capping layer 2920 includes a dielectric material such as a semiconductor oxide, a semiconductor nitride, a semiconductor oxynitride, and/or a semiconductor carbide. Additionally or in the alternative, the capping layer 2920 may include a conductive material to increase the conductive surface area in contact with a subsequently formed contact. Suitable conductive materials include non-metallic conductors, metals, and/or metal compounds, such as metal oxides, metal nitrides, and/or other metal compounds. In various exemplary embodiments, a conductive capping layer includes TiO and/or AlO. The capping layer 2920 may be formed on the gate electrode layer 2918 by CVD, PVD, ALD, and/or other suitable deposition technique.

The gate stack 2908 may also include one or more sidewall spacing layers 2922 and 2924, of which two are shown. In a typical gate replacement process, the gate stack 2908 is first formed with a sacrificial or dummy gate (typically polysilicon). The sidewall spacing layers 2922 and 2924 are formed on the sacrificial gate, and then the sacrificial material is removed. The sidewall spacing layers 2922 and 2924 remain and give shape to the subsequently formed gate elements such as the gate electrode layer 2918, the capping layer 2920, and, in some embodiments, the gate dielectric layer 2916 and/or the interfacial layer 2914.

Suitable materials for the sidewall spacing layers 2922 and 2924 include dielectrics such as semiconductor oxides, semiconductor nitrides, semiconductor oxynitrides, semiconductor carbides, and/or other dielectrics. In some examples, the sidewall spacing layers 2922 and 2924 include alternating layers of different dielectrics such as a first semiconductor oxide spacing layer 2922 and a second semiconductor nitride spacing layer 2924. Any of a number of techniques may be used to form the sidewall spacing layers 2922 and 2924 including CVD, PVD, ALD, and/or other suitable deposition techniques. For example, in an embodiment, a dielectric material is deposited conformally on the gate stack 2908 and an anisotropic etch is used to remove the horizontal portions of the dielectric leaving only the vertical portions to form a sidewall spacing layer. Suitable conformal deposition techniques include CVD and HDP-CVD. Other techniques for forming the sidewall spacing layers 2922 and 2924 are both contemplated and provided for.

The semiconductor device may also include one or more ILD layers 2926 (represented as translucent in FIG. 29) formed on the substrate 201 and surrounding the fin structures 2902 and the gate stacks 2908. The ILD layers 2926 may be substantially similar to ILD layers 250 and 290 of FIGS. 2-19. For example, the ILD layers 2926 may include a semiconductor oxide, a semiconductor nitride, a semiconductor oxynitride, TEOS oxide, phosphosilicate glass (PSG), borophosphosilicate glass (BPSG), fluorinated silica glass (FSG), carbon doped silicon oxide, Black Diamond®, Xerogel, Aerogel, amorphous fluorinated carbon, Parylene, BCB (bis-benzocyclobutenes), SiLK (Dow Chemical, Midland, Mich.), polyimide, other suitable materials, and/or combinations thereof.

For reference, a cross-sectional plane 2928 of the semiconductor device 2900 is defined along the channel region 2906. FIGS. 30-34 are cross sectional views of slices taken along the cross sectional plane 2928. Referring to block 2804 of FIG. 28 and to FIG. 30, a layer of photoresist 3002 is applied to the top surface of the ILD layer 2926 and patterned to form openings exposing regions of the ILD layer 2926 to be etched. This may be performed substantially as described in step 115 of FIG. 1. Referring to block 2806 of FIG. 28 and to FIG. 31, a first etching technique using a first etching chemistry is performed on the ILD layer 2926 in order to etch portions of the ILD layer 2926 exposed by the photoresist 3002. The first etching process may be performed substantially as described in step 116 of FIG. 1 and may include any suitable anisotropic or isotropic etching technique including dry etching, wet etching, reactive ion etching RIE, and/or combinations thereof. In the illustrated embodiment, the first etching process utilizes an anisotropic etching technique configured to etch vertically through the ILD layer 2926 with minimal lateral etching. As can be seen, the first etching process exposes the gate electrode layer 2918 through the ILD layer 2926. This may include etching through the capping layer 2920 if one is included in the gate stack 2908. Selectively etching the ILD layer 2926 and the gate electrode layer 2918 may be achieved by adjusting the etching technique, the etchant, and/or other etching parameters based on the materials to be etched. In the present embodiment, a dry anisotropic plasma etch equipped with fluorine-containing gases, such as $CF_4$, $CH_2F_2$, or $C_4F_6$, is used.

Figure 32:
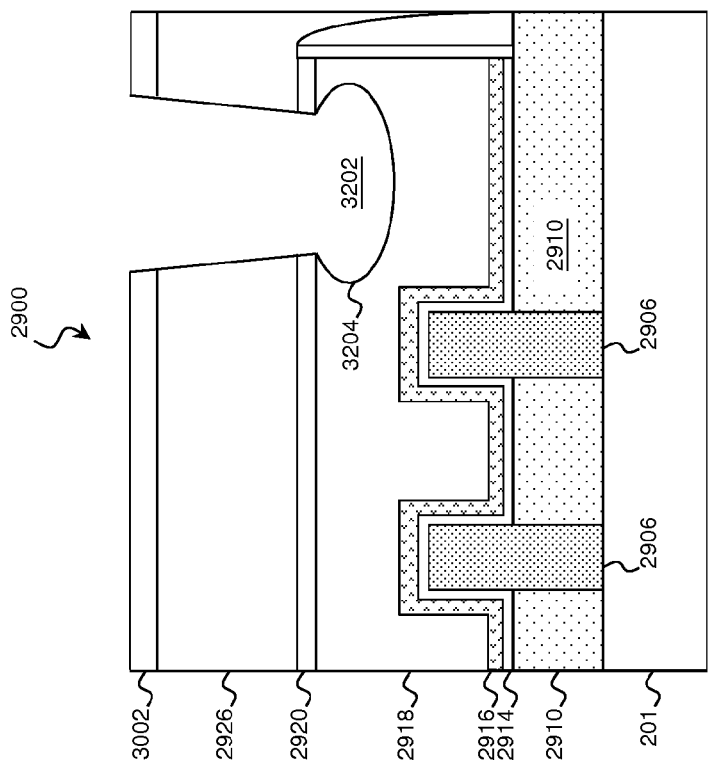

Referring to block 2808 of FIG. 28 and to FIG. 32, a second etching process is performed substantially as described in step 117 of FIG. 1 in order to create a cavity in the gate electrode layer 2918. The second etching process may utilize a non-directional, or isotropic, etching technique configured to create the cavity so that it includes an undercut portion 3202 within the gate electrode layer 2918. In the illustrated embodiment, the undercut portion 3202 has a substantially symmetrical curvilinear surface 3204 and has its largest horizontal width (as measured parallel to the surface of the substrate 201) in an interior portion of the gate electrode layer 2918. This creates an overhang of the gate electrode material above the undercut portion 3202, which provides increased contact area between the gate electrode layer 2918 and a subsequently formed contact. The increased surface area may reduce resistivity at the contact interface and may also provide a more secure electrical connection.

While an isotropic etching technique is shown, the second etching process may include any suitable anisotropic or isotropic etching technique including dry etching, wet etching, reactive ion etching RIE, and combinations thereof. The second etching process may use any suitable etch chemistry or combination thereof, and in some embodiments, the etchants and other etching parameters are be tuned so that the gate electrode layer 2918 of the gate stack 2908 is etched without etching the sidewall spacing layers 2922 and 2924, the gate dielectric layer 2916, or the fin structures 2902. The second etching process may further interact with the ILD layer 2926 to taper the profile of the contact openings. The patterned photoresist 3002 may be removed before, during, or after the second etching process.

Figure 33:
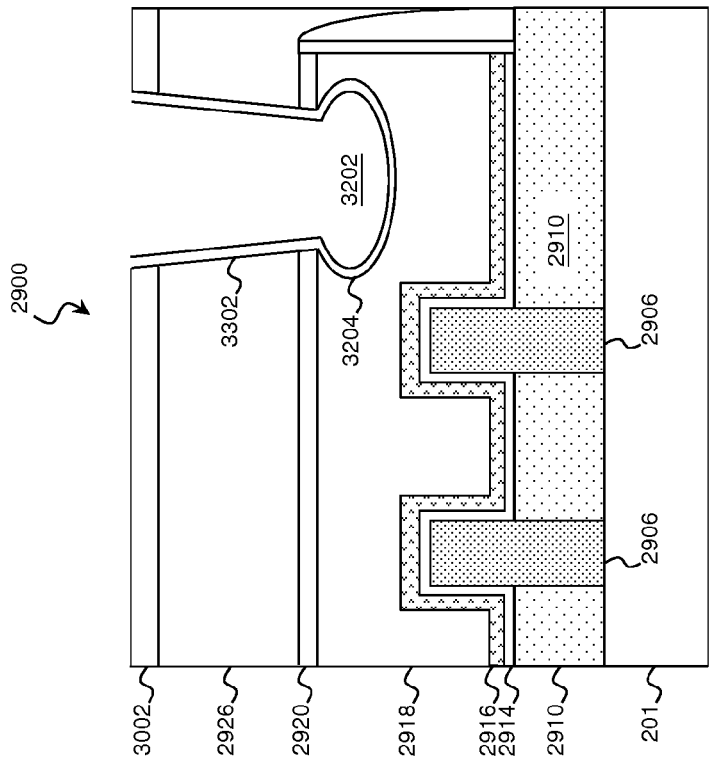

Referring to block 2810 of FIG. 28 and to FIG. 33, a glue layer or adhesion layer 3302 is deposited on the ILD layer 2926, the curvilinear surface 3204 of the undercut portion 3202, and on the capping layer 2920 if the gate stack 2908 so includes. The glue layer 3302 may include one or more layers of conductive materials including metals, metal oxides, and/or metal nitrides, which may be deposited via CVD, PECVD, ALD, PEALD, PVD, and/or other suitable deposition process substantially as described in step 118 of FIG. 1. In the present embodiment, the glue layer 3302 includes multiple deposited layers of Ti and TiN.

Figure 34:
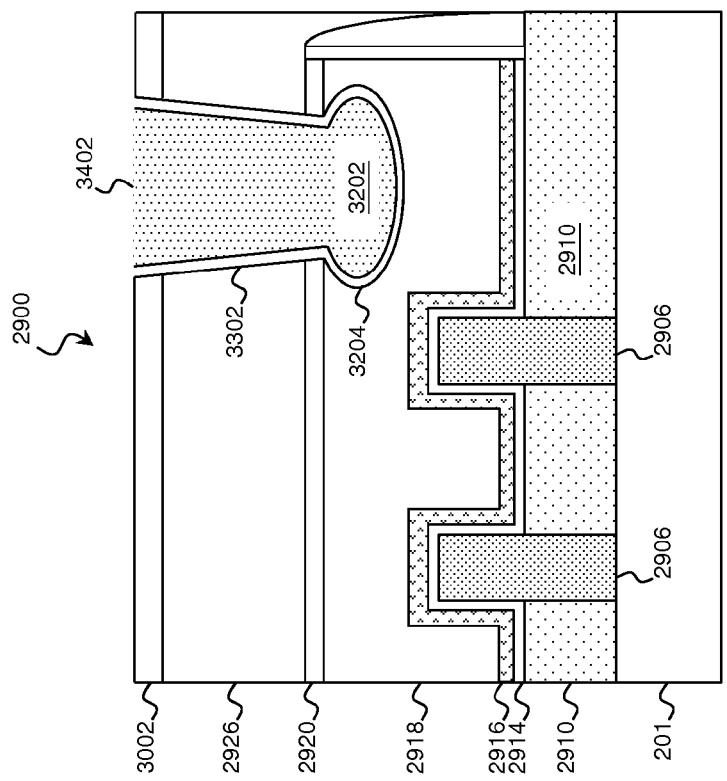

Referring to block 2812 of FIG. 28 and to FIG. 34 the trenches are filled with a contact fill material 3402, which may be performed substantially as described in step 119 of FIG. 1. The deposited contact fill material 3402 may form contacts to the gate stack 2908 as well as to the source/drain (S/D) regions 2904 (the source/drain regions 2904 and the respective contacts are not in the illustrated cross-sectional plane). Because of the undercut portion 3202, the gate electrode layer 2918 surrounds the contact fill material 3402, and at least some of the gate electrode layer 2918 is disposed on top of the contact fill material 3402 (opposite the substrate). This increases the surface area between the gate electrode layer 2918 and the contact fill material 3402 and may improve the electrical connection therebetween.

The contact fill material 3402 may include one or more layers of any suitable conductive materials including metals, metal oxides, metal nitrides, and/or combinations thereof. In one such embodiment, the contact fill material 3402 contains a barrier layer of that includes W, Ti, TiN, or Ru and a Cu-containing fill material disposed on the barrier layer. In another embodiment, the contact fill material 3402 includes tungsten. The contact fill material 3402 may be deposited by any suitable technique including PVD (e.g., sputtering), CVD, PE CVD, ALD, PEALD, and/or combinations thereof. Deposition may be followed by a CMP process to remove contact fill material 3402 extending beyond the ILD layer 2926.

An alternate contact alignment that may be formed by the method 2800 is described with reference to FIGS. 35-39. This contact configuration may be used in conjunction with the configuration of FIGS. 30-34, and both may be formed concurrently on the same substrate 201. Except as noted, the contact and the method of forming are substantially similar to that described with respect to FIGS. 28-34.

Figure 35:
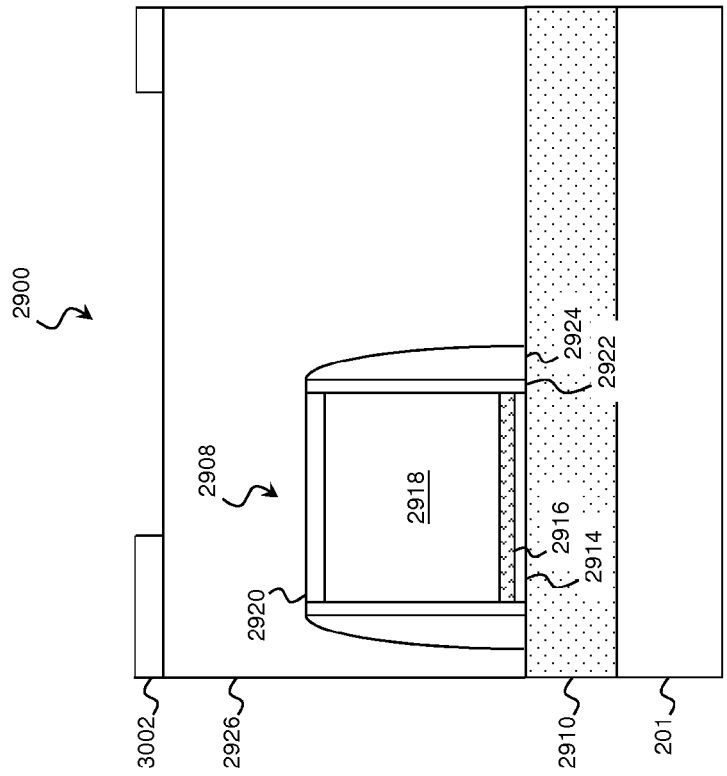
FIGS. 35-39 are cross-sectional views of the semiconductor device undergoing the method of FIG. 28 to form an alternate contact configuration according to various embodiments of the present invention.

Referring to block 2802 of FIG. 28 and to FIG. 35, a semiconductor device 2900, substantially similar to that of FIGS. 29-34 is received. The semiconductor device 2900 includes a gate stack 2908 to which a contact is to be formed. In contrast to the above examples, the gate contact is shaped and aligned so that it extends beyond the gate stack 2908.

Referring to block 2804 of FIG. 28 and to FIG. 35, a layer of photoresist 3002 is applied to the top surface of the ILD layer 2926 and patterned to form openings exposing regions of the ILD layer 2926 to be etched. This may be performed substantially as described in step 115 of FIG. 1. Referring to block 2806 of FIG. 28 and to FIG. 36, a first etching technique substantially similar to that of step 116 of FIG. 1 is performed to etch portions of the ILD layer 2926 exposed by the photoresist 3002. In addition to etching the ILD layer 2926 and the capping layer 2920 (if present), the first etching process removes a portion of one or more of the sidewall spacing layers 2922 and/or 2924. By so doing, the etching exposes additional surface area of the gate electrode layer 2918 for contact formation.

Figure 37:
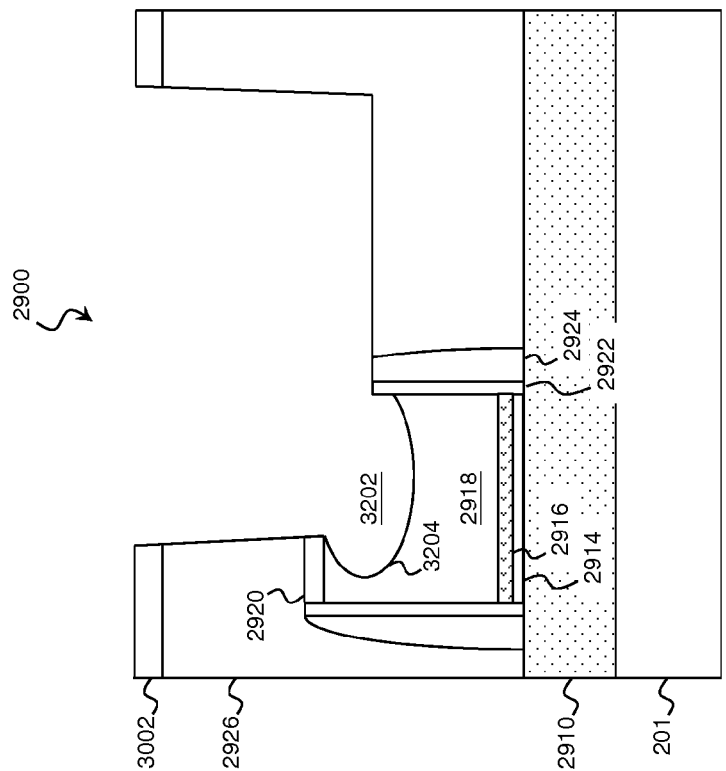
Figure 36:
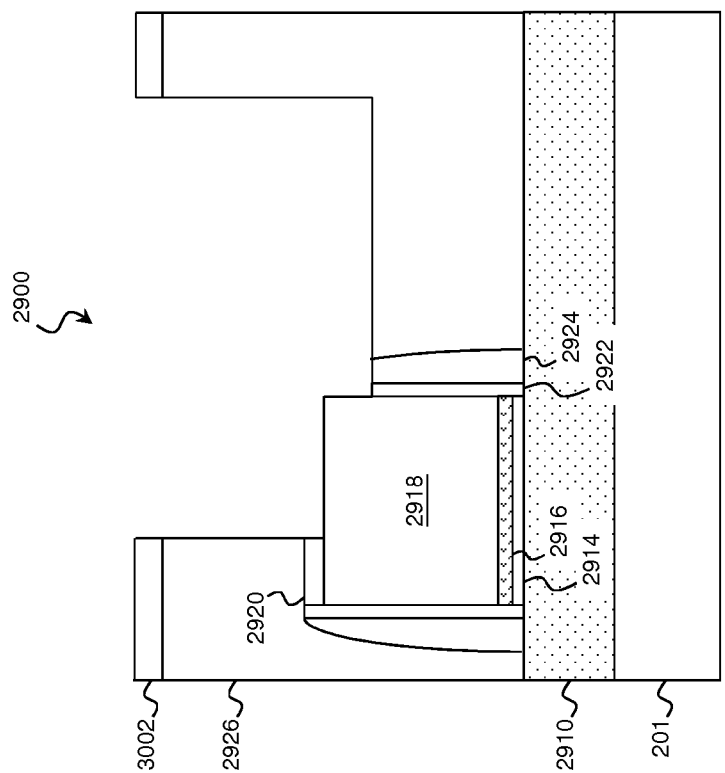

Referring to block 2808 of FIG. 28 and to FIG. 37, a second etching process is performed substantially as described in step 117 of FIG. 1 in order to create a cavity in the gate electrode layer 2918. The second etching process may utilize a non-directional, or isotropic, etching technique configured to create the cavity so that it includes an undercut portion 3202 within the gate electrode layer 2918. In the illustrated embodiment, the undercut portion 3202 has a substantially symmetrical curvilinear surface 3204 within the gate electrode layer 2918 and has its largest horizontal width (as measured parallel to the surface of the substrate 201) within an interior portion of the gate electrode layer 2918. This creates an overhang of the gate electrode material above the undercut portion 3202, which provides increased contact area between the gate electrode layer 2918 and a subsequently formed contact. The increased surface area may reduce resistivity at the contact interface and may also provide a more secure electrical connection.

In the illustrated embodiment, the curvilinear surface 3204 extends throughout the gate electrode layer 2918 until it reaches the sidewall spacing layer 2922. The second etching process may be configured to produce minimal (if any) etching of the sidewall spacing layer 2922. In this way, the undercut portion 3202 does not extend into the sidewall spacing layer 2922. Accordingly, the second etching process may use any suitable etch chemistry or combination thereof, and in some embodiments, the etchants and other etching parameters are be tuned so that the gate electrode layer 2918 of the gate stack 2908 is etched without etching the sidewall spacing layers 2922 and 2924. While an isotropic etching technique is shown, the second etching process may include any suitable anisotropic or isotropic etching technique including dry etching, wet etching, reactive ion etching RIE, and combinations thereof. The second etching process may further interact with the ILD layer 2926 to taper the profile of the contact openings. The patterned photoresist 3002 may be removed before, during, or after the second etching process.

Figure 38:
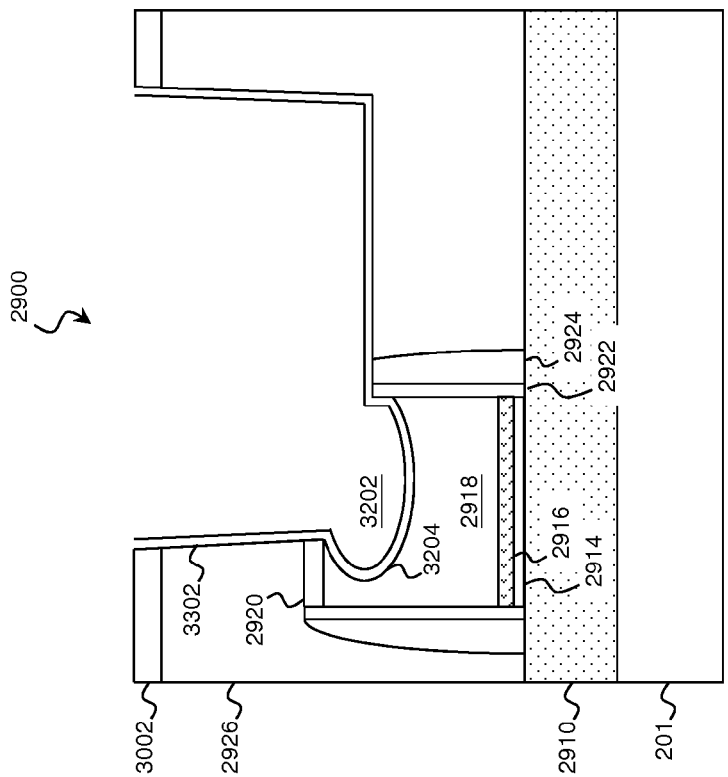

Referring to block 2810 of FIG. 28 and to FIG. 38, a glue layer or adhesion layer 3302 is deposited on the ILD layer 2926, the curvilinear surface 3204 of the undercut portion 3202, and on the capping layer 2920 if the gate stack 2908 so includes. The glue layer 3302 may include one or more layers of conductive materials including metals, metal oxides, and/or metal nitrides, which may be deposited via ALD, CVD, PE CVD PEALD, PVD, and/or other suitable deposition process substantially as described in step 118 of FIG. 1. In the present embodiment, the glue layer 3302 includes multiple deposited layers of Ti and TiN.

Figure 39:
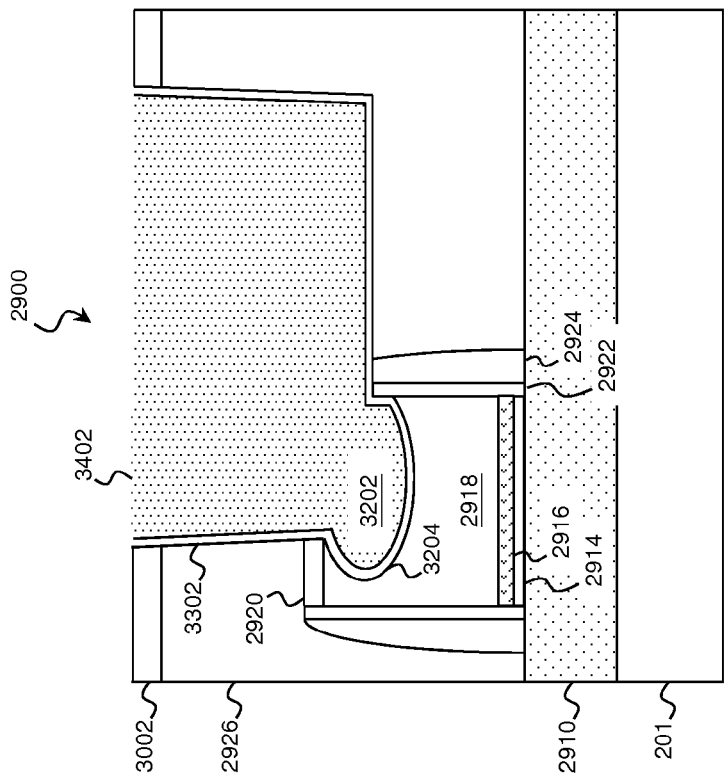

Referring to block 2812 of FIG. 28 and to FIG. 39 the trenches are filled with a contact fill material 3402, which may be performed substantially as described in step 119 of FIG. 1. The deposited contact fill material 3402 may form contacts to the gate stack 2908 as well as to the source/drain (S/D) regions 2904 (the source/drain structures 2904 and the respective contacts are not in the illustrated cross-sectional plane). Because of the undercut portion 3202, the gate electrode layer 2918 surrounds the contact fill material 3402, and at least some of the gate electrode layer 2918 is disposed on top of the contact fill material 3402 (opposite the substrate). This increases the surface area between the gate electrode layer 2918 and the contact fill material 3402 and may improve the electrical connection therebetween.

The contact fill material 3402 may include one or more layers of any suitable conductive materials including metals, metal oxides, metal nitrides, and/or combinations thereof. In one such embodiment, the contact fill material 3402 contains a barrier layer of that includes W, Ti, TiN, or Ru and a Cu-containing fill material disposed on the barrier layer. In another embodiment, the contact fill material 3402 includes tungsten. The contact fill material 3402 may be deposited by any suitable technique including PVD (e.g., sputtering), CVD, PE CVD, ALD, PEALD, and/or combinations thereof. Deposition may be followed by a CMP process to remove contact fill material 3402 extending beyond the ILD layer 2926.

The present disclosure is not limited to applications in which the semiconductor structure includes a FET (e.g. MOS transistor) and may be extended to other integrated circuit having a metal gate stack. For example, the semiconductor structures may include a dynamic random access memory (DRAM) cell, an imaging sensor, a capacitor and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   receiving a circuit element, wherein the circuit element includes: a gate stack disposed on a semiconductor substrate; and an interlayer dielectric disposed on the gate stack, and wherein the gate stack includes a gate electrode;
   etching the interlayer dielectric to expose a portion of the gate electrode;
   etching the gate electrode to form a cavity therein such that a portion of the gate electrode overhangs the cavity; and
   depositing a conductive material within the cavity and in electrical contact with the gate electrode.

2. The method of claim 1 further comprising depositing an adhesion layer within the cavity, wherein the depositing of the conductive material deposits the conductive material on the adhesion layer.

3. The method of claim 1, wherein the etching of the gate electrode is configured to form a curvilinear surface of the gate electrode that defines the cavity.

4. The method of claim 1, wherein the gate stack further includes a work function layer disposed between the gate electrode and the semiconductor substrate, and wherein the work function layer extends along at least one side surface of the gate electrode.

5. The method of claim 4, wherein the etching of the gate electrode is configured to expose a portion of the work function layer without etching the work function layer.

6. The method of claim 4, wherein the etching of the gate electrode is configured to form the cavity shaped such that at least one of the deposited conductive material or an adhesion layer is in physical contact with the work function layer.

7. The method of claim 1, wherein the gate stack is disposed over a fin structure extending from the semiconductor substrate.

8. The method of claim 7, wherein the etching of the gate stack forms the cavity extending beyond the gate stack in a direction parallel to a surface of the substrate.

9. The method of claim 7, wherein the gate stack includes a capping layer disposed between the gate electrode and the interlayer dielectric, and wherein the etching of the interlayer dielectric includes etching the capping layer to expose the portion of the gate electrode.

10. A method comprising:
    receiving a substrate, wherein the substrate includes a gate stack disposed thereupon and an interlayer material disposed on and around the gate stack, and wherein the gate stack includes: a dielectric layer disposed on the substrate; and a gate electrode disposed on the dielectric layer;
    performing an etching technique on the interlayer material to expose a portion of the gate electrode;
    performing an isotropic etch of the gate electrode to form a recess therein having a maximum width located in an interior portion of the gate electrode; and
    depositing a conductive material within the recess and within an etched portion of the interlayer material to form a gate contact.

11. The method of claim 10, wherein the isotropic etch of the gate electrode is configured to form the recess having a curvilinear profile.

12. The method of claim 10, wherein the gate electrode has a side surface that defines an interface between the gate electrode and an adjacent structure, and wherein the isotropic etch is configured to form the recess having a linear surface at the interface.

13. The method of claim 10,
    wherein the dielectric layer is further disposed along a side surface of each of a pair of opposing sidewall structures to form a U-shaped dielectric structure,
    wherein the gate stack further includes a conductive material disposed on at least a bottom surface and two side surfaces of the dielectric layer, and
    wherein the gate electrode is disposed on at least a bottom surface and two side surfaces of the conductive material.

14. The method of claim 13, wherein the isotropic etch of the gate electrode is configured to expose a portion of the conductive material.

15. The method of claim 14, wherein the isotropic etch of the gate electrode is further configured to expose the portion of the conductive material without etching the conductive material.

16. A method of forming an integrated circuit comprising:
    forming a gate stack over a substrate, the gate stack including a gate dielectric and a gate electrode, wherein the gate electrode has a side surface that defines an interface between the gate electrode and an adjacent structure;
    disposing an interlayer material around the gate stack, including an opening that exposes a portion of the gate electrode;
    etching the gate electrode to form a recess therein having a maximum width located in an interior portion of the gate electrode, wherein the etching is an isotropic etch configured to form the recess having a linear surface at the interface; and
    depositing a conductive material within the recess.

17. The method of claim 16, wherein the etching is further configured to form the recess having a curvilinear surface extending from the linear surface.

18. The method of claim 16,
    wherein the gate dielectric is further disposed along a side surface of each of a pair of opposing sidewall structures to form a U-shaped dielectric structure,
    wherein the gate stack further includes a conductive material disposed on at least a bottom surface and two side surfaces of the dielectric layer, and
    wherein the gate electrode is disposed on at least a bottom surface and two side surfaces of the conductive material.

19. The method of claim 16, wherein the gate electrode is disposed within a work function layer, and wherein the linear surface is an exposed surface of the work function layer.

* * * * *